US010541153B2

(12) United States Patent
Kapusta et al.

(10) Patent No.: US 10,541,153 B2
(45) Date of Patent: Jan. 21, 2020

(54) ELECTRONICS PACKAGE WITH INTEGRATED INTERCONNECT STRUCTURE AND METHOD OF MANUFACTURING THEREOF

(71) Applicant: General Electric Company, Schenectady, NY (US)

(72) Inventors: Christopher James Kapusta, Delanson, NY (US); Raymond Albert Fillion, Niskayuna, NY (US); Risto Ilkka Sakari Tuominen, Tokyo (JP); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/668,468

(22) Filed: Aug. 3, 2017

(65) Prior Publication Data

US 2019/0043733 A1  Feb. 7, 2019

(51) Int. Cl.
*H01L 21/48*  (2006.01)
*H01L 21/56*  (2006.01)
(Continued)

(52) U.S. Cl.
CPC .......... *H01L 21/485* (2013.01); *H01L 21/486* (2013.01); *H01L 21/4853* (2013.01);
(Continued)

(58) Field of Classification Search
CPC . H01L 21/485; H01L 21/4857; H01L 23/3114
(Continued)

(56) References Cited

U.S. PATENT DOCUMENTS 6,306,680 B1    10/2001  Fillion et al.
6,433,412 B2 *   8/2002  Ando .................... H01L 21/563
                                                                257/676
(Continued)

FOREIGN PATENT DOCUMENTS

JP   2004-281541 A    10/2004
KR   2015-0042362 A    4/2015

OTHER PUBLICATIONS

Ozmat et al., "A New Power Module Packaging Technology For Enhanced Thermal Performance," The Seventh Intersociety Conference on Thermal and Thermomechanical Phenomena in Electronic Systems, May 23-26, 2000, pp. 287-296.
(Continued)

*Primary Examiner* — Sheikh Maruf
(74) *Attorney, Agent, or Firm* — Ziolkowski Patent Solutions Group, SC

(57) ABSTRACT

An electronics package includes an insulating substrate, an electrical component having a back surface coupled to a first surface of the insulating substrate, and an insulating structure surrounding at least a portion of a perimeter of the electrical component. A first wiring layer extends from the first surface of the insulating substrate and over a sloped side surface of the insulating structure to electrically couple with at least one contact pad on an active surface of the electrical component. A second wiring layer is formed on a second surface of the insulating substrate and extends through at least one via therein to electrically couple with the first wiring layer.

20 Claims, 12 Drawing Sheets

(51) Int. Cl.
*H01L 21/52* (2006.01)
*H01L 23/28* (2006.01)
*H01L 23/31* (2006.01)

(52) U.S. Cl.
CPC ...... *H01L 21/4857* (2013.01); *H01L 21/4889* (2013.01); *H01L 21/52* (2013.01); *H01L 21/56* (2013.01); *H01L 23/28* (2013.01); *H01L 23/3114* (2013.01)

(58) Field of Classification Search
USPC .................................................. 257/770–774
See application file for complete search history.

(56) References Cited

U.S. PATENT DOCUMENTS

| | | | |
|---|---|---|---|
| 6,774,499 B1 | 8/2004 | Yang et al. | |
| 7,752,751 B2 | 7/2010 | Kapusta et al. | |
| 7,777,351 B1* | 8/2010 | Berry ................. | H01L 23/3128 257/778 |
| 7,902,660 B1* | 3/2011 | Lee ..................... | H01L 21/4857 257/698 |
| 8,115,117 B2 | 2/2012 | Kapusta et al. | |
| 8,276,268 B2 | 10/2012 | Kapusta et al. | |
| 9,337,163 B2 | 5/2016 | Delgado et al. | |
| 9,391,027 B2 | 7/2016 | Chauhan et al. | |
| 9,520,385 B1* | 12/2016 | Chen ..................... | H01L 25/105 |
| 2002/0090162 A1 | 7/2002 | Asada et al. | |
| 2003/0146503 A1 | 8/2003 | Khan et al. | |
| 2004/0155322 A1 | 8/2004 | Cho et al. | |
| 2005/0090050 A1 | 4/2005 | Shim et al. | |
| 2005/0189636 A1* | 9/2005 | Savastiouk ........... | H01L 23/147 257/678 |
| 2007/0069391 A1 | 3/2007 | Gritti et al. | |
| 2007/0096311 A1 | 5/2007 | Humpston et al. | |
| 2008/0087996 A1* | 4/2008 | Miyaki ............... | H01L 21/4821 257/677 |
| 2008/0179503 A1 | 7/2008 | Camargo et al. | |
| 2008/0272470 A1 | 11/2008 | Do et al. | |
| 2008/0315371 A1 | 12/2008 | Tang et al. | |
| 2009/0057898 A1* | 3/2009 | Takaike ................ | H01L 21/485 257/738 |
| 2009/0075428 A1 | 3/2009 | Tang et al. | |
| 2009/0190009 A1 | 7/2009 | Kawasaki | |
| 2009/0291296 A1 | 11/2009 | McConnelee et al. | |
| 2009/0315057 A1 | 12/2009 | Konishi et al. | |
| 2010/0019338 A1 | 1/2010 | Kwon et al. | |
| 2010/0148335 A1 | 6/2010 | Mikami et al. | |
| 2010/0224992 A1 | 9/2010 | McConnelee et al. | |
| 2010/0230800 A1 | 9/2010 | Beaupre et al. | |
| 2010/0237477 A1 | 9/2010 | Pagaila et al. | |
| 2010/0295178 A1 | 11/2010 | Ishihara et al. | |
| 2011/0012269 A1 | 1/2011 | Ishihara et al. | |
| 2011/0024888 A1 | 2/2011 | Pagaila et al. | |
| 2011/0031598 A1* | 2/2011 | Lee ................... | H01L 23/49827 257/686 |
| 2011/0057311 A1* | 3/2011 | Yutani ................. | H01L 21/485 257/737 |
| 2011/0080713 A1* | 4/2011 | Sunohara ............. | H01L 23/147 361/760 |
| 2011/0084386 A1 | 4/2011 | Pendse | |
| 2011/0095441 A1 | 4/2011 | Fjelstad et al. | |
| 2011/0266665 A1 | 11/2011 | Gowda et al. | |
| 2011/0316140 A1 | 12/2011 | Nalla et al. | |
| 2012/0005887 A1* | 1/2012 | Mortensen ............... | C25D 1/00 29/829 |
| 2012/0009738 A1 | 1/2012 | Crawford et al. | |
| 2012/0049339 A1* | 3/2012 | Wang .................. | H01L 21/563 257/693 |
| 2012/0080786 A1* | 4/2012 | Furutani ............... | H01L 21/568 257/737 |
| 2012/0086109 A1 | 4/2012 | Kim et al. | |
| 2012/0112336 A1 | 5/2012 | Guzek et al. | |
| 2012/0126423 A1 | 5/2012 | Hatori et al. | |
| 2012/0139095 A1 | 6/2012 | Manusharow et al. | |
| 2012/0139116 A1 | 6/2012 | Manusharow et al. | |
| 2012/0319274 A1 | 12/2012 | Tanaka et al. | |
| 2012/0319284 A1* | 12/2012 | Ko ............................ | H01L 24/92 257/773 |
| 2013/0052776 A1 | 2/2013 | Nalla et al. | |
| 2013/0134559 A1* | 5/2013 | Lin .................. | H01L 23/49827 257/620 |
| 2013/0154108 A1* | 6/2013 | Lin ..................... | H01L 23/5389 257/774 |
| 2013/0256865 A1* | 10/2013 | Umeki ................... | H01L 23/28 257/690 |
| 2014/0008785 A1 | 1/2014 | Lin et al. | |
| 2014/0029210 A1 | 1/2014 | Gowda et al. | |
| 2014/0029234 A1 | 1/2014 | Chauhan et al. | |
| 2014/0048951 A1 | 2/2014 | Lin et al. | |
| 2014/0077364 A1 | 3/2014 | Marimuthu et al. | |
| 2014/0103527 A1 | 4/2014 | Marimuthu et al. | |
| 2014/0133104 A1 | 5/2014 | Delgado et al. | |
| 2014/0138807 A1 | 5/2014 | Gowda et al. | |
| 2014/0239477 A1 | 8/2014 | Kim et al. | |
| 2014/0252646 A1* | 9/2014 | Hung ................... | H01L 23/481 257/774 |
| 2014/0264800 A1 | 9/2014 | Gowda et al. | |
| 2014/0312503 A1* | 10/2014 | Seo ................... | H01L 27/14636 257/774 |
| 2014/0319679 A1 | 10/2014 | Lin et al. | |
| 2014/0332937 A1 | 11/2014 | Brunnbauer et al. | |
| 2015/0001708 A1 | 1/2015 | Lin | |
| 2015/0014844 A1* | 1/2015 | Wu .................... | H01L 23/49811 257/737 |
| 2015/0069612 A1 | 3/2015 | Chauhan et al. | |
| 2015/0084207 A1 | 3/2015 | Chauhan et al. | |
| 2015/0102502 A1* | 4/2015 | Chiu ..................... | H01L 21/561 257/774 |
| 2015/0187607 A1* | 7/2015 | Huang .................. | H01L 21/565 438/126 |
| 2015/0194375 A1 | 7/2015 | Gowda et al. | |
| 2015/0255418 A1 | 9/2015 | Gowda et al. | |
| 2015/0255432 A1* | 9/2015 | Lin ....................... | H01L 21/565 257/774 |
| 2016/0093525 A1* | 3/2016 | Cook ................... | H01L 21/4867 257/676 |
| 2016/0093597 A1* | 3/2016 | Chang ................. | H01L 21/4853 257/737 |
| 2016/0104666 A1 | 4/2016 | Gowda et al. | |
| 2016/0218049 A1* | 7/2016 | Lin .......................... | H01L 24/97 |
| 2016/0276311 A1* | 9/2016 | Meyer ..................... | H01L 21/568 |
| 2016/0315055 A1* | 10/2016 | Vogt ........................ | H01L 25/50 |
| 2017/0047266 A1* | 2/2017 | Ihara ..................... | H01L 23/3675 |
| 2017/0092567 A1 | 3/2017 | Vincent et al. | |
| 2017/0117200 A1 | 4/2017 | Kim et al. | |
| 2017/0141045 A1* | 5/2017 | Kim ....................... | H01L 23/552 |
| 2017/0141053 A1* | 5/2017 | Chen ...................... | H01L 21/565 |
| 2017/0154854 A1* | 6/2017 | Xiao ....................... | H01L 21/485 |
| 2017/0162523 A1 | 6/2017 | Hu | |
| 2017/0334714 A1* | 11/2017 | Gao .......................... | B81B 7/02 |
| 2018/0026010 A1* | 1/2018 | Huang ................... | H01L 25/0657 257/659 |
| 2018/0082981 A1* | 3/2018 | Gowda ............... | H01L 23/5385 |
| 2018/0114745 A1* | 4/2018 | Oratti Kalandar ......................... H01L 23/49568 |
| 2018/0190581 A1 | 7/2018 | Lin | |

OTHER PUBLICATIONS

Ozmat et al., "An Advanced Approach to Power Module Packaging," International Workshop on Integrated Power Packaging, Jul. 14-15, 2000, pp. 8-11.
Tentzeris et al., "3D-/Inkjet-Printed RF Packages and Modules for IoT Applications up to sub-THz frequencies," The 67th Electronic Components and Technology Conference, ECTC 2017, pp. 1-37.
Esfahani et al., "High Aspect Ratio Lithography for Litho-Defined Wire Bonding," 2014 Electronic Components & Technology Conference, pp. 1556-1561.
Tehrani et al., "Inkjet-Printed 3D Interconnects for Millimeter-Wave System-on-Package Solutions," 2016 IEEE, pp. 1-4.

(56) References Cited

OTHER PUBLICATIONS

Hedges et al., "3D Aerosol Jet Printing—Adding Electronics Functionality to RPRM," Optomec, DDMC 2012 Conference, Mar. 14-15, 2012, pp. 1-5.

Tuominen et al., "Component Embedding Platform for Thin Profile SiP, POP and Fan-Out WLP," 2015 17th Electronics Packaging Technology Conference, Dec. 2-4, 2015, pp. 1-6.

Fisher et al., "High Frequency, Low Cost, Power Packaging Using Thin Film Power Overlay Technology," Tenth Annual Applied Power Electronics Conference and Exposition, APEC '95, Mar. 5-9, 1995, pp. 12-17.

Fukui et al., "MEMS Manufacturing Solutions," 26th Annual Advanced Semiconductor Manufacturing Conference (ASMC), May 3-6, 2015, pp. 356-361.

Gdula et al., "An Overlay Interconnect Technology for 1GHz. and Above MCMs," IEEE Proceedings Multi-Chip Module Conference, MCMC '92, Mar. 18-20, 1992, pp. 171-174.

International Search Report and Written Opinion issued in connection with corresponding PCT Application No. PCT/US18/43060 dated Nov. 6, 2018.

International Search Report and Written Opinion issued in connection with corresponding PCT Application No. PCT/US18/43003 dated Nov. 7, 2018.

\* cited by examiner

ELECTRONICS PACKAGE WITH INTEGRATED INTERCONNECT STRUCTURE AND METHOD OF MANUFACTURING THEREOF

BACKGROUND OF THE INVENTION

Embodiments of the invention relate generally to semiconductor device packages or electronics packages and, more particularly, to an electronics package that includes an integrated interconnect structure formed from an insulating material that is metalized to include one or more electrical traces, which extend through the body of the electronics package to electrically connect contact pads on the die to contact terminals on the opposing side of the electronics package.

State of the art electronics packaging covers a wide range of methods, structures, and approaches from wire bond modules to flip chip modules and to embedded chip modules. Wire bonded modules are a mature packaging approach that is low cost but has limited electrical performance. These modules use wires bonded to chip pads to connect the top I/O pads of power devices to an interconnect structure such as a metal-insulator-metal substrate such as ceramic, Aluminum Nitride (AlN), or Silicon Carbide (SiC) substrate with patterned metal on top and bottom. Wire bonds have inherently high inductance, generally high series resistance, current crowding on the bond pads, and microcracking within the semiconductor devices near bonding sites. An exemplary construction of a prior art wire bond electronics package 10 is illustrated in FIG. 1 with two power semiconductor devices 12 mounted onto a leadframe 14 using die attach material 16. Portions of the leadframe 14 extend beyond the molding resin 26 forming terminals 18. Wire bonds 20 connect die pads 22 located on the active surface 24 of semiconductor devices 12 to selected areas on the leadframe 14. Molding resin 26 encapsulates semiconductor devices 12, wire bonds 20, and exposed portions of leadframe 14. PowerRibbon© Bonding (K&S) is a modified version of power module wire bonding that replaces Al wire bonds with Al ribbons that use thermos-compression to bond to the chip pads. Beneficially, PowerRibbon© Bonding has lower resistance and therefore is targeted for higher current modules. However, PowerRibbon© Bonding has high inductance and can cause substrate microcracking.

Prior art flip chip modules experience reduced semiconductor module damage as compared to wire bond packages through the use of solder bumps, which have larger current carrying cross-sections than wire bonds. A general construction of a prior art flip chip electronic package 28 is illustrated in FIG. 2 with two semiconductor devices 12 attached to a top side metal layer 30 of substrate 32 by means of flip chip solder bumps 34. Thermal cooling is achieved with thermal connections 36 formed on the back side 38 of semiconductor devices 12. Molding resin 26 encapsulates the semiconductor devices 12, with portions of the top side metal layer 30 extending beyond the molding resin 26 forming terminals 18. While flip chip modules such as that illustrated in FIG. 2 provide some advantages over wire bond technology, the flip chip solder bumps have poor electrical conductivity, require additional pad metallization layers to apply solder bumps, are susceptible to solder fatigue, and provide a very poor thermal cooling pathway.

Prior art embedded device modules, such as the embedded device module 40 illustrated in FIG. 3 fabricated using General Electric Company's power overlay (POL) technology, address the limitations of wire bond and flip chip packages by eliminating wire bonds and solder bumps and replacing them with direct metallization contacts. In the embedded device module 40, semiconductor devices 12 are mounted onto a dielectric film 42. A post connector 44 is also attached to the dielectric film 42 to provide a top-to-bottom electrical connection for the module 40. Microvias 46 are formed through the dielectric film 42 to the input/output (I/O) contact pads 22 of semiconductor devices 12 and to the post connector 44. A metallization layer 48 is applied to the outer surface of the dielectric film 42, the microvias 46 and the exposed pads 22 to form an electrical connection to the semiconductor devices 12. The dielectric film 42 with attached semiconductor devices 12 and post connector 44 is bonded to a power substrate 32 using an electrically conductive die attach material 50 such as solder. The gaps between semiconductor devices 12 and post connector 44 are filled with a molding resin 26. The embedded device module 40 has reduced parasitics (e.g., resistance, capacitance, and inductance) and a superior thermal performance as compared to wire bond modules or flip chip modules.

Despite the advantages of an embedded device module construction, POL technology is more complex, less mature, and higher cost than wire bond and flip chip approaches. Electrical connections within the module 40 are typically formed by either forming through holes in the module 40 using laser drilling and hole metallization or by forming a via to an inserted I/O structure or frame adjacent to the device that provide vertical connections. These approaches increase the complexity and cost of the module and can increase the module footprint.

Accordingly, it would be desirable to provide a new electronics packaging technology that permits construction of a highly miniaturized electronics package that allows for high pitch or high pin count applications and that provides an electrical connection between the bottom surface of the electronics package to the top of the semiconductor device or to an upper layer of the electronics package. Further, it would be desirable to have a packaging approach that has the performance and reliability advantages of embedded chip modules and the lower costs of wire bond or flip chip modules.

BRIEF DESCRIPTION OF THE INVENTION

In accordance with one aspect of the invention, an electronics package includes an insulating substrate, an electrical component having a back surface coupled to a first surface of the insulating substrate, and an insulating structure surrounding at least a portion of a perimeter of the electrical component. A first wiring layer extends from the first surface of the insulating substrate and over a sloped side surface of the insulating structure to electrically couple with at least one contact pad on an active surface of the electrical component. A second wiring layer is formed on a second surface of the insulating substrate and extends through at least one via therein to electrically couple with the first wiring layer.

In accordance with another aspect of the invention, a method of manufacturing an electronics package includes coupling a back surface of an electrical component to a first surface of an insulating substrate and forming an insulating structure around at least a portion of a perimeter of the electrical component. The method also includes forming a first wiring layer on a portion of the first surface of the insulating substrate and over a sloped side surface of the insulating structure to electrically couple with at least one contact pad on an active surface of the electrical component.

The method further includes electrically coupling the first wiring layer to a second wiring layer disposed on a second surface of the insulating substrate through at least one via formed through the insulating substrate.

In accordance with another aspect of the invention, an electronics package includes an electrical component having a back surface coupled to a first surface of an insulating substrate and an active surface facing away from the insulating substrate, the active surface having at least one of imaging and optical functionality. The electronics package also includes an insulating structure surrounding a perimeter of the electrical component and covering a portion of the active surface thereof. A first wiring layer is formed on a sloped side wall of the insulating structure and is electrically coupled to at least one contact pad on the active surface of the electrical component. A second wiring layer is formed on a second surface of the insulating substrate and is electrically coupled to the first wiring layer through at least one via formed in the insulating substrate.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
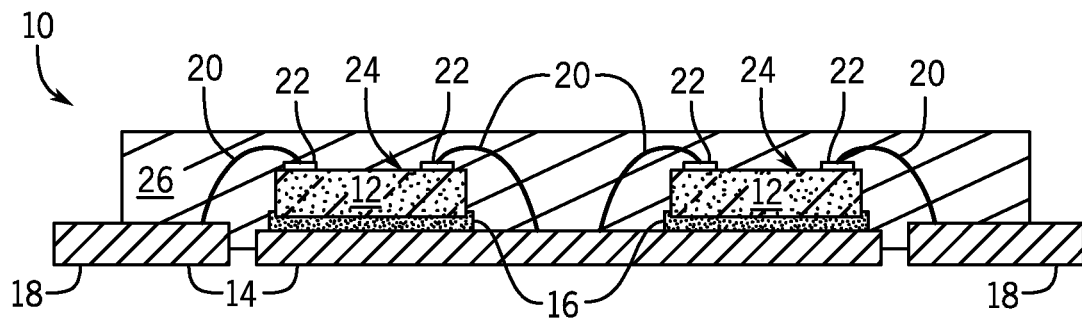
FIG. 1 is a schematic cross-sectional view of an exemplary prior art wire bond electronic package.
Figure 2:
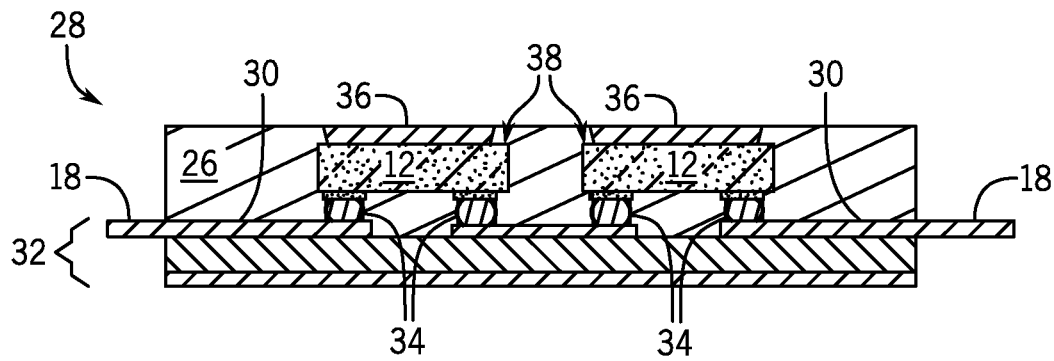
FIG. 2 is a schematic cross-sectional view of an exemplary prior art flip chip electronic package.
Figure 3:
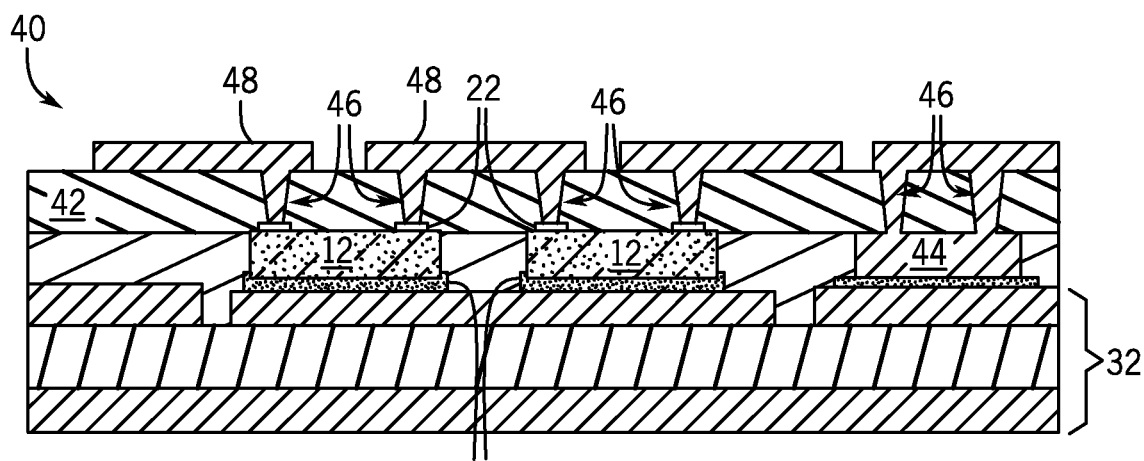
FIG. 3 is a schematic cross-sectional view of an exemplary prior art embedded chip electronic package.

Embodiments of the present invention provide for an electronics package or module in which the electrical interconnect(s) between the contact pads of the electrical component are routed from one side of the electronics package, through the body of the electronics package, and to the other side of the electronics package along one or more sloped side walls of a localized insulating structure or encapsulation material, thereby eliminating the need for conventional through hole structures. Complex routing can be patterned on the outer surface of this localized insulating structure to provide electrical interconnects between the I/O pads of the electrical component and back side connections of the electronics package. Embodiments of the invention therefore provide for an electronics package that includes high electrical conductivity connections from the semiconductor device to the terminals of the electronics package with a direct thermal path having low thermal conductivity. The resulting electronics package can be surface mounted onto a substrate or placed within a multi-component module for complex circuits.

As used herein, the term "semiconductor device" refers to a semiconductor component, device, die or chip that perform specific functions such as a power transistor, power diode, analog amplifier, RF element, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein may be power semiconductor devices used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices may also be digital logic devices, such as a microprocessor, microcontroller, memory device, video processor, or an Application Specific Integrated Circuit (ASIC), as non-limiting examples.

While the various embodiments of an electronics package referenced below are shown and described as including a particular arrangement of a semiconductor device, interconnection wiring and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor devices including acoustic devices, microwave devices, millimeter devices, RF communication devices, and micro-mechanical (MEMS) devices. The electronics packages described herein may also include one or more resistors, capacitors, inductors, filters and similar devices and combinations thereof. As used herein the terms "electrical component" and "electronic component" may be understood to encompass any of the various types of semiconductor devices described above as well as resistors, capacitors, inductors, filters and similar passive devices, and energy storage components.

Figure 4:
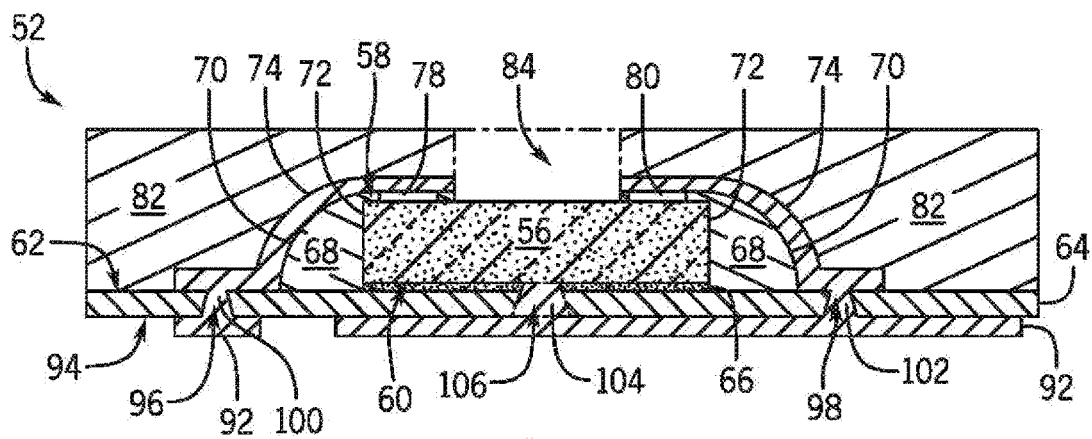
FIG. 4 is a schematic cross-sectional view of an electronics package, according to an embodiment of the invention.
Figure 6:
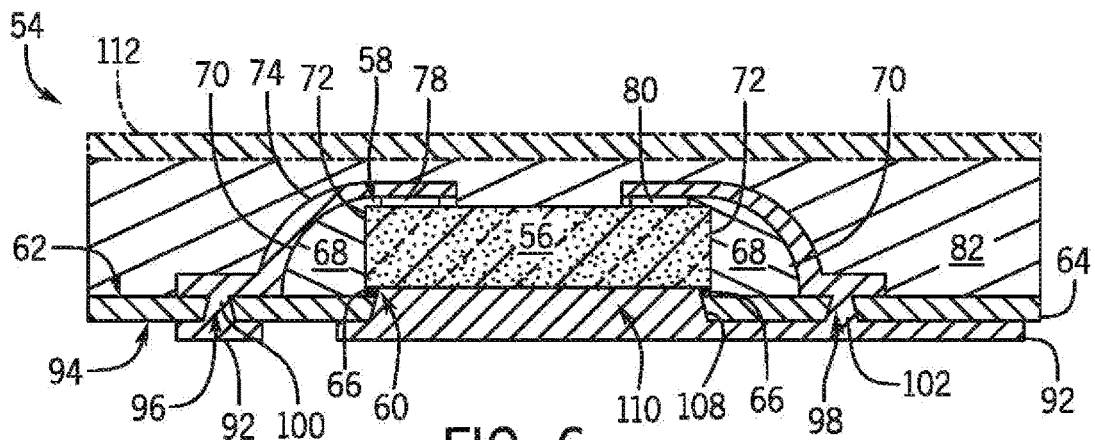
FIG. 6 is a schematic cross-sectional view of an electronics package, according to another embodiment of the invention.

FIGS. 4 and 6 illustrate electronics packages 52, 54 according to alternative embodiments of the invention. Packages 52, 54 include a semiconductor device 56 having an active surface 58 and a back surface 60 or back side surface as well as a number of similar components that are referenced with common part numbers as appropriate. While each package 52, 54 are shown with only a single embedded semiconductor device 56, it is contemplated that alternative embodiments may include multiple semiconductor devices as well as one or more passive devices such as, for example, capacitors, resistors, and/or inductors, which may be integrated into packages to packages 52, 54 in a number of different configurations, including those shown in FIGS. 11 and 12.

Referring now to the electronics package 52 shown in FIG. 4, the back surface 60 of semiconductor device 56 is coupled to a first surface 62 of an insulating substrate 64 using a component attach material 66. According to various embodiments, insulating substrate 64 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, or inorganic films such as ceramic or glass, as non-limiting examples. Component attach material 66 is an electrically insulating material that adheres to surrounding components of the electronics package 52 such as a polymeric material (e.g., epoxy, silicone, liquid crystal polymer, or a ceramic, silica, or metal filled polymer) or other organic material as non-limiting examples. In some embodiments, component attach material 66 is provided on insulating substrate 64 in either an uncured or partial cured (i.e., B-stage) form. Alternatively, component attach material 66 may be applied to semiconductor device 56 prior to placement on insulating substrate 64. In alternative embodiments, semiconductor device 56 may be affixed to insulating substrate 64 by way of an adhesive property of the insulating substrate 64 itself. In such an embodiment, component attach material 66 is omitted and insulating substrate 64 is provided in the form of a single dielectric layer having adhesive properties. Non-limiting examples of such an adhesive dielectric layer include a spin-on dielectric such as polyimide or polybenzoxazole (PBO).

Figure 5:
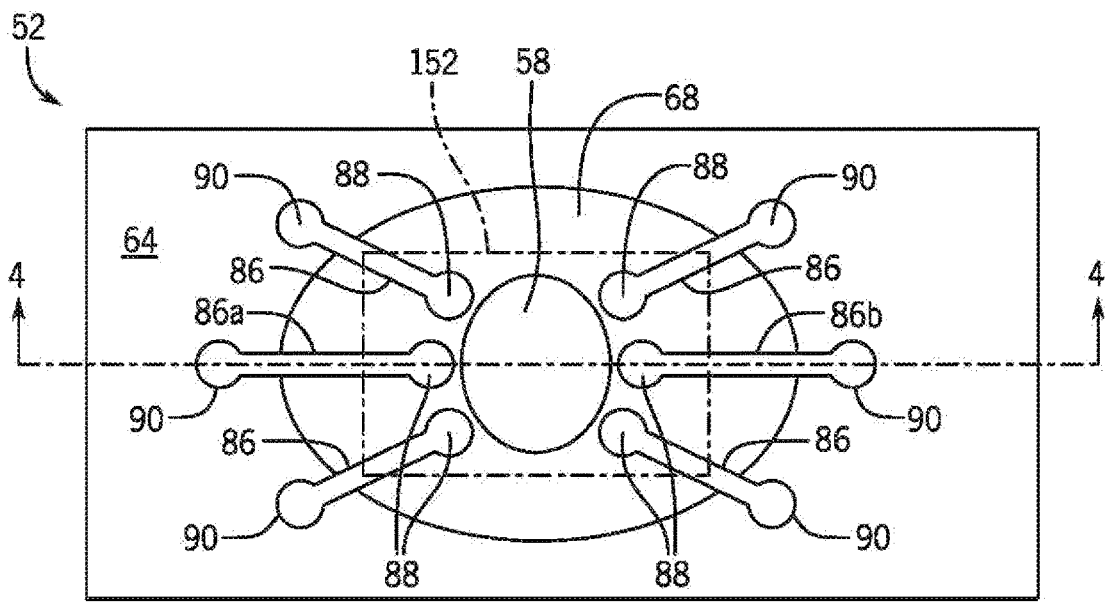
FIG. 5 is a topside view of the electronics package of FIG. 4 with the insulating material omitted.

An insulating structure 68 with at least one sloped side surface or sloped side wall 70 is coupled to the first surface 62 of insulating substrate 64. According to alternative embodiments, insulating structure 68 may be a cured photo-patternable resin, a polymer such as, for example, an epoxy material, a pre-preg material, an inorganic material, a composite dielectric material, or any other electrically insulating organic or inorganic material. In the illustrated embodiment, insulating structure 68 is formed such that it fully surrounds the outer perimeter 152 of semiconductor device 56, as shown in FIG. 5. In alternative embodiments, the insulating structure 68 may be formed to cover one but not all four side walls 72 of the semiconductor device 56.

A first wiring layer 74 is disposed on the insulating structure 68. First wiring layer 74 is preferably a patterned metal layer such as aluminum, copper, gold, silver, nickel, or combinations thereof as non-limiting examples. Alternatively, first wiring layer 74 can be an electrically conductive polymer. As shown, first wiring layer 74 is positioned on an outer surface 70 of insulating structure 68 and forms an electrical connection with contact pads 78, 80 located on the active surface 58 of semiconductor device 56. Contact pads 78, 80 provide conductive routes (I/O connections) to internal contacts within semiconductor device 56. Contact pads 78, 80 may have a composition that includes a variety of electrically conductive materials such as aluminum, copper, gold, silver, nickel, or combinations thereof as non-limiting examples. While illustrated as structures that protrude outward from the active surface 58 of semiconductor device 56, contact pads 78, 80 may also be contact terminals located substantially flush or level with the active surface 58 of semiconductor device 56. First wiring layer 74 then extends down the sloped side wall 70 and covers a portion of the first surface 62 of insulating substrate 64.

An electrically insulating material 82 overlays the semiconductor device 56, the insulating structure 68, first wiring layer 74, and exposed portions of the first surface 62 of insulating substrate 64. Insulating material 82 may encapsulate all of semiconductor device 56 or portions thereof, in alternative embodiments. For example, in embodiments where semiconductor device 56 is an optical component and active surface 58 has optical functionality, an optional opening 84 (shown in phantom) is formed within insulating material 82 above a portion of the active surface 58 of semiconductor device 56. In alternative embodiments, an optically transparent material may be used to form all of insulating material 82 or only a portion of the insulating material 82 located within the region depicted in FIG. 4. It is contemplated that a similar opening or optically transparent material may be integrated within the other embodiments of electronics packages disclosed herein in a similar manner.

A topside view of electronics package 52 is provided in FIG. 5, with the insulating material 82 omitted for purposes of clarity to illustrate an exemplary configuration of first wiring layer 74. As shown, first wiring layer 74 includes multiple electrical traces 86 that each include a topside terminal pad 88 located on the outer surface 74 of insulating structure 68 and a bottom side terminal pad 90 on the first surface 62 of insulating substrate 64. Each of these electrical traces 86 may be configured to create connections on the top side of the electronics package 52 to respective contact pads 78, 80 of semiconductor device 56. One skilled in the art will recognize that the arrangement of electrical traces 86 is not limited to that illustrated in FIG. 5 and that electrical traces 86 may be formed in numerous alternative configurations based on the contact pad configuration of semiconductor device 56 and the desired location of I/Os within the final electronics package. Further, the width and/or thickness of the electrical traces 86 may be varied from trace to trace within the electronics package 52 depending on the current carrying requirements and particular function of the associated contact pad 78, 80, with wider and/or thicker traces 86 being formed to contact pads with higher current carrying requirements as appropriate.

Referring again to FIGS. 4 & 5, a second wiring layer 92 or metallization layer is disposed on a second surface 94 of insulating substrate 64. The second wiring layer 92 extends into vias 96, 98 created through insulating substrate 64, thereby forming penetrating contacts 100, 102 that extend through vias 96, 98 to electrically couple select portions or traces of first wiring layer 74 to second wiring layer 92. In the illustrated and non-limiting example, penetrating contact 100 electrically connects second wiring layer 92 to electrical trace 86a and contact pad 78 of semiconductor device 56. Penetrating contact 102 electrically connects second wiring layer 92 to electrical trace 86b and contact pad 80 of semiconductor device 56. Alternative embodiments may include more or less penetrating contacts than illustrated in FIG. 4 depending on the design of semiconductor device 56. Optionally, a penetrating contact 104 (shown in phantom) extends through an optional via 106 (shown in phantom) located under semiconductor device 56 and forms an electrical connection with the back surface 60 of semiconductor device 56. Penetrating contacts 104 may either be in direct physical contact with the back surface 60 of semiconductor device 56 or electrically couple with back surface 60 through component attach material 66 in embodiments where component attach material 66 is provided as an electrically conductive material.

Referring now to FIG. 6, electronics package 54 is illustrated according to another embodiment of the invention. Similar to electronics package 52, the semiconductor device 56 of electronics package 54 is mounted on insulating substrate 64 with its back surface 60 joined to insulating substrate 64 with a component attach material 66. First wiring layer 74 is formed in a similar manner as described above for electronics package 52 and may include electrical traces arranged in a similar manner as that shown in FIG. 5 or in any number of alternative configurations based on the particular arrangement of contact pads on the active surface of semiconductor device 56. Second wiring layer 92 is formed on the second surface 94 of insulating substrate 64 and creates penetrating contacts 100, 102 within vias 96, 98. Second wiring layer 92 also includes a back side thermal structure 108 that extends through a larger through hole or via 110. Back side thermal structure 108 aids in heat transfer from semiconductor device 56 in embodiments where semiconductor device 56 is a lateral device. In alternative embodiments where semiconductor device 56 is a vertical power semiconductor die, structure 108 services as a thermal structure and an electrical interconnect—specifically a drain connection. In one embodiment, back side thermal structure 108 is plated directly on the back surface 60 of semiconductor device 56. One skilled in the art will understand that any of the electronics packages disclosed herein may include the back side thermal structure 108 (FIG. 6), one or more penetrating contacts 104 (FIG. 4), or be formed free of any connections to the back surface 60 of the semiconductor device 56 based on the design specifications of the particular electronics package.

In one embodiment, an optional second insulating substrate 112 (shown in phantom) is applied to the top surface 124 of insulating material 82. Second insulating substrate 112 may be formed from any of the same materials as described for insulating substrate 64 and may be integrated within any of the other electronics packages disclosed herein in a similar manner.

Figure 7:
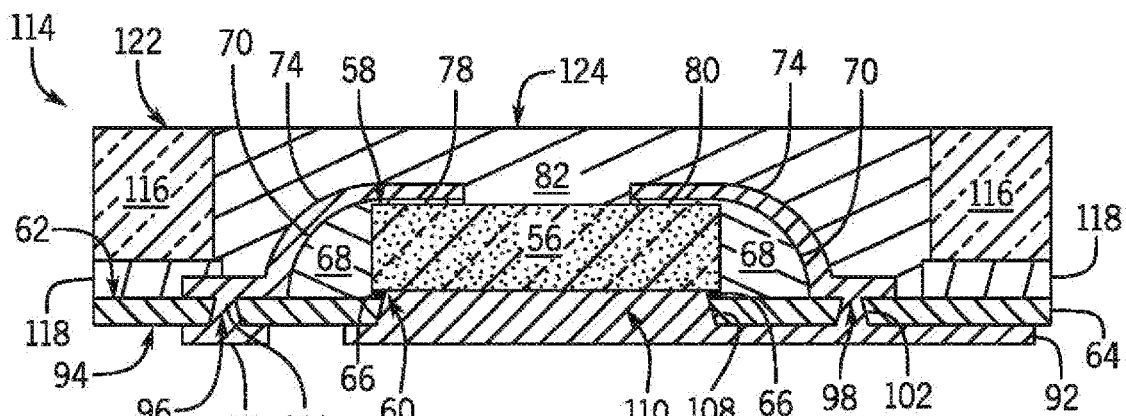
FIG. 7 is a schematic cross-sectional view of an electronics package including a support substrate, according to an embodiment of the invention.

An electronics package 114 is illustrated in FIG. 7 according to yet another embodiment of the invention. Electronics package 114 includes many of the same components as electronics package 52 of FIG. 4, which are depicted with common part numbers. Electronics package 114 also includes back side thermal structure 108 similar to electronics package 54 (FIG. 6). In addition to the components common to electronics package 52 and electronics package 54, electronics package 114 also includes a support substrate or core structure 116 that provides additional dimensional stability to electronics package 114. In one embodiment, core structure 116 is coupled to first surface 62 of insulating substrate 64 with a layer of joining material 118. Core structure 116 may be a printed circuit board (PCB) core material, such as, for example, an epoxy material with a fiberglass mat, a pre-preg material, polyimide film/layer, a ceramic material, glass, aluminum, a composite dielectric material, or other similar/suitable organic material or inorganic material that provides mechanical robustness to electronics package 114.

Figure 8:
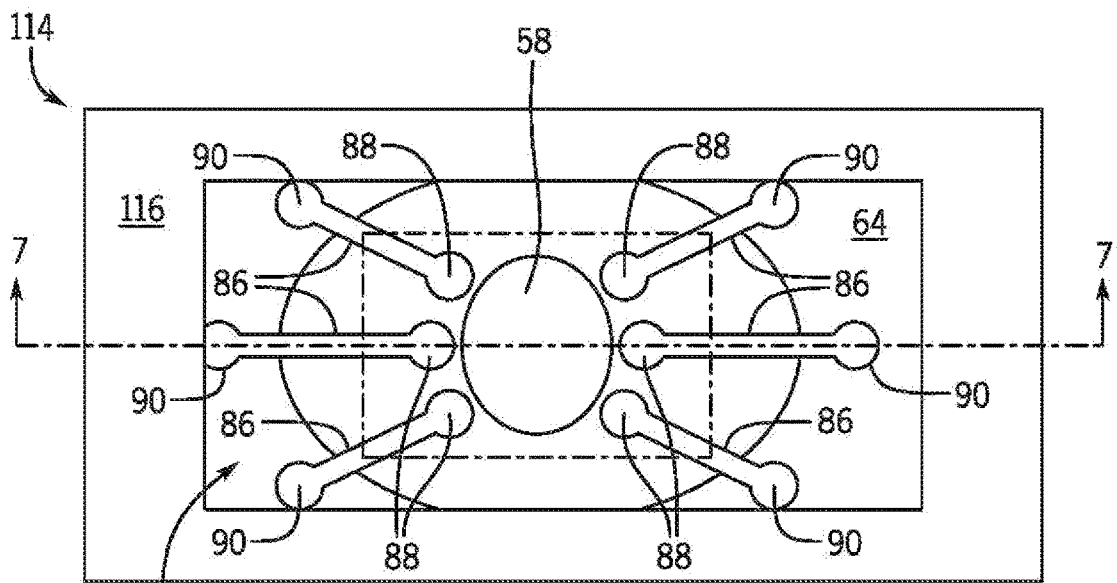
FIG. 8 is a topside view of the electronics package of FIG. 7.

As shown in FIG. 8, core structure 116 includes an opening 120 that surrounds semiconductor device 56 and insulating structure 68. Opening 120 may be formed for example by mechanical punch, laser cutting, water jet or mechanical milling. Insulating material 82 fills the gaps between core structure 116 and insulating substrate 64 and covers first wiring layer 74. In the illustrated embodiment, the top surface 122 of core structure 116 is coplanar with the top surface 124 of insulating material 82. In alternative embodiments, core structure 116 may be entirely embedded within insulating material 82 such that the top surface 122 of core structure 116 is coated with insulating material 82. While not illustrated in FIG. 7, in embodiments where core structure 116 is a printed circuit board, it is contemplated that it would have wiring on its topside and/or bottom side and second wiring layer 92 may extend through additional microvias in joining material 118 and in insulating substrate 64 to electrically couple with contact locations on the bottom surface core structure 116. It is contemplated that core structure 116 may be incorporated within any of the other electronics packages disclosed herein in a similar manner.

Figure 9:
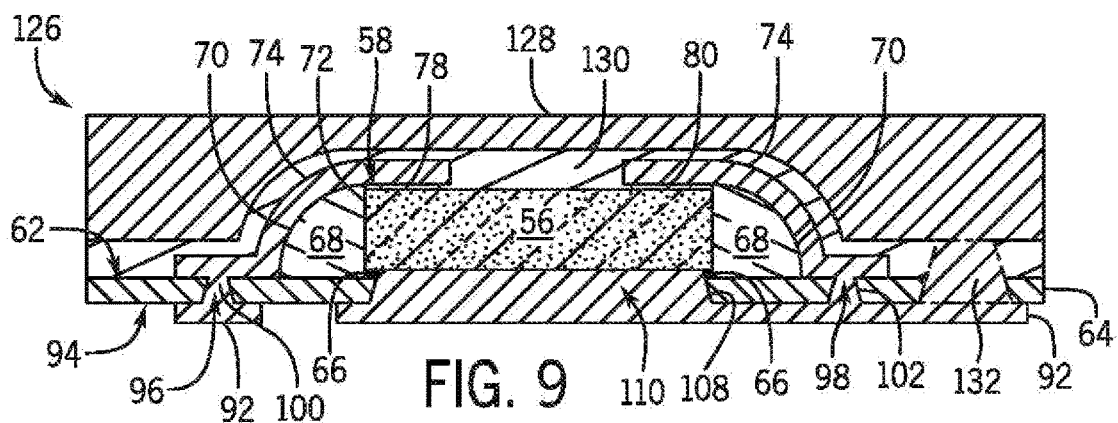
FIG. 9 is a schematic cross-sectional view of an electronics package including a thermal structure, according to yet another embodiment of the invention.

Yet another embodiment of an electronics package 126 is illustrated in FIG. 9. Similar components to electronics package 126 and electronics packages 52, 54 are referred to with similar part numbering as appropriate. In this embodiment, a top side thermal structure 128 or thermally conductive structure is provided in place of the insulating material 82 of FIG. 4. Top side thermal structure 128 is bonded to insulating substrate 64 with a layer of thermally conductive joining layer or material 130 such as, for example, a thermal grease or thermal adhesive. This layer of thermally conductive material 130 covers the first wiring layer 74 and exposed regions of insulating substrate 64, insulating structure 68, and the active surface 58 of semiconductor device 56. In an alternative embodiment, this layer of thermally conductive material 130 may be replaced with a thermally insulating organic adhesive material such as, for example, epoxy. Top side thermal structure 128 is a metallic or inorganic material having a high thermally conductivity, such as, for example copper, Silicon carbide, Beryllium oxide, or Aluminum nitride, as non-limiting examples. In alternative embodiments, top side thermal structure 128 may include an opening sized to surround all or a portion of semiconductor device 56 and insulating structure 68, similar to core structure 116 of FIGS. 7 and 8.

Similar to electronics package 54, the second wiring layer 92 of electronics package 126 extends through vias 96, 98 in insulating substrate 64 to couple with first wiring layer 74. Electronics package 126 also includes a back side thermal structure 108 that extends through via 110 to couple with the back surface 60 of semiconductor device 56. In one embodiment, electronics package 126 also includes one or more optional conductive through holes 132 (shown in phantom), which couple second wiring layer 92 to top side thermal structure 128. Through hole(s) 132 function to form a ground connection with top side thermal structure 128 and/or aid in heat transfer between the top side and bottom side of the electronics package 126.

Figure 10:
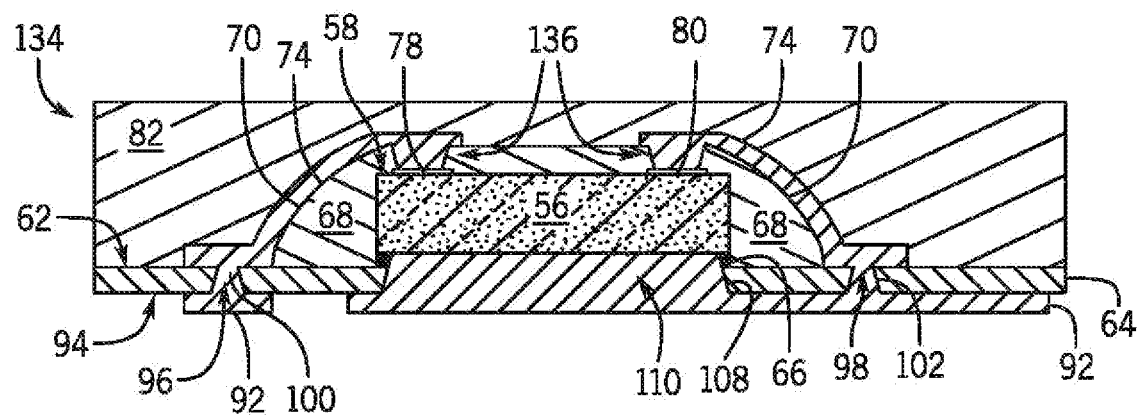
FIG. 10 is a schematic cross-sectional view of an electronics package, according to an embodiment of the invention.

Referring now to FIG. 10, an alternative embodiment of an electronics package 134 is shown in which the insulating structure 68 is formed to cover the entirety of the active surface 58 of semiconductor device 56. In this embodiment, microvias 136 are formed through the insulating structure 68 at locations aligned with contact pads 78, 80 and the first wiring layer 74 extends through these microvias 136 to electrically couple with contact pads 78, 80. The addition of microvias 136 may provide for a more reliable electrical connection between first wiring layer 74 and contact pads 78, 80. As compared to the configuration of first wiring layer 74 in FIGS. 4, 6, 7, and 10, the addition of microvias 136 also permits first wiring layer 74 to be offset at a greater distance from the active surface 58 of semiconductor device 56 and therefore aids in avoiding the possibility of first wiring layer 74 forming a short circuit between the active surface 58 and back surface 60 of semiconductor device 56.

Figure 11:
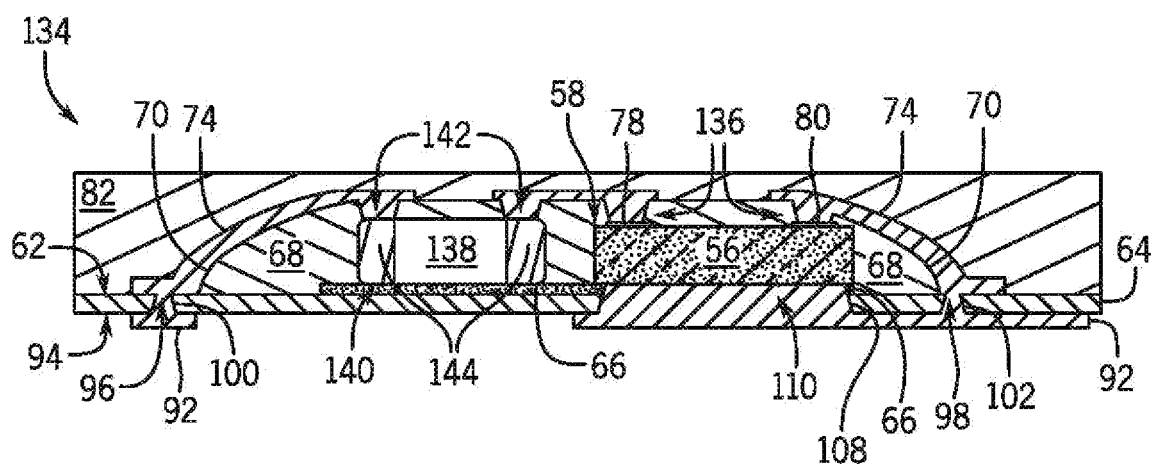
FIG. 11 is a schematic cross-sectional view of an electronics package including a passive component, according to an embodiment of the invention.

An alternative embodiment of electronics package 134 that includes a passive component 138 is illustrated in FIG. 11. As one non-limiting example where semiconductor device 56 is a power device, passive component 136 may be a capacitor. As shown, a mounting surface 140 of passive component 138 is coupled to the first surface 62 of insulating substrate 64 by way of component attach material 66. Portions of the first wiring layer 74 extend through vias 142 in the insulating structure 68 to electrically couple with terminals 144 of the passive component 138 and selectively electrically connect the terminals 144 to one or more contact pads 78 of semiconductor device 56. It is contemplated that one or more passive components may be incorporated within any of the other electronics packages disclosed herein in a similar manner. In a preferred embodiment, the thickness of the passive component 138 would be selected to approximately equal to the thickness on the semiconductor device 56. Alternatively, a passive component may be coupled to the first surface 62 of insulating substrate 64 at a location outside the insulating structure 68.

Figure 12A:
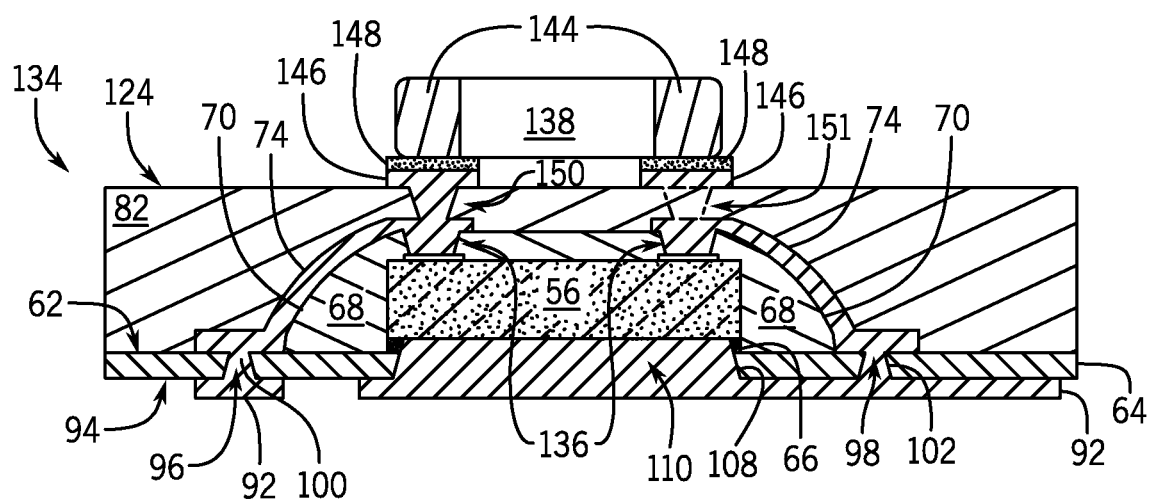
FIG. 12A is a schematic cross-sectional view of an electronics package including a passive component, according to another embodiment of the invention.
Figure 12B:
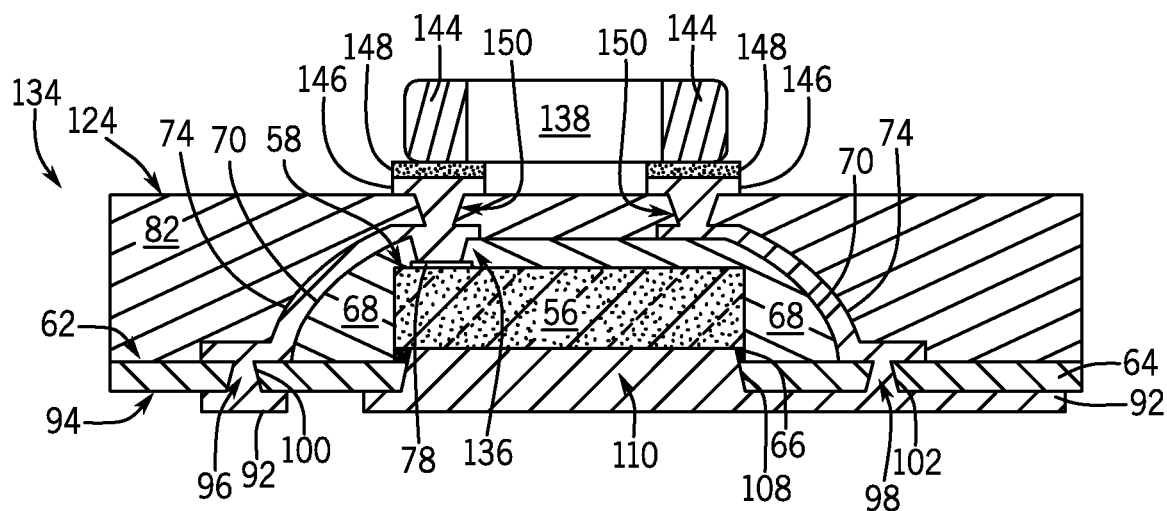
FIG. 12B is a schematic cross-sectional view of an electronics package including a passive component, according to another embodiment of the invention.

In yet another alternative embodiments shown in FIGS. 12A and 12B, electronics package 134 may be modified to include a passive component 138 stacked above semiconductor device 56. In these embodiments, terminals 144 of passive component 138 are coupled to a third wiring layer 146 by way of electrical connection elements 148. According to alternative embodiments, electrical connection elements 148 are an electrically conductive material such as, for example, solder or a conductive adhesive. Third wiring layer 146 is formed on the top surface 124 of insulating material 82 and extends through one or more vias 150, 151 formed in the insulating material 82, which are electrically coupled to wiring layer 74. Third wiring layer 146 is formed from similar materials and patterned in a similar manner as described above for second wiring layer 92.

In the embodiment illustrated in FIG. 12A, metallized microvias 136 electrically couple both terminals 144 of passive component 138 to respective contact pads 78, 80 on semiconductor device 56. In an alternative configuration shown in FIG. 12B, one terminal 144 of passive component 138 is coupled to a contact pad 78 of semiconductor device 56 through vias 136, 150 while the other terminal 144 of passive component 138 is electrically coupled to wiring layer 74 through via 150. In yet another alternate embodiment, both terminals 144 of passive component 138 are electrically coupled to wiring layer 74 while remaining electrically isolated from contact pads 78, 80. It is contemplated that modifications to the configuration and location of wiring layer 74 and vias 136, 150, 151 may be made to arrive at alternative connection configurations between terminals 144, wiring layer 74, contact pads 78, 80, or other types of component contacts.

Figure 18:
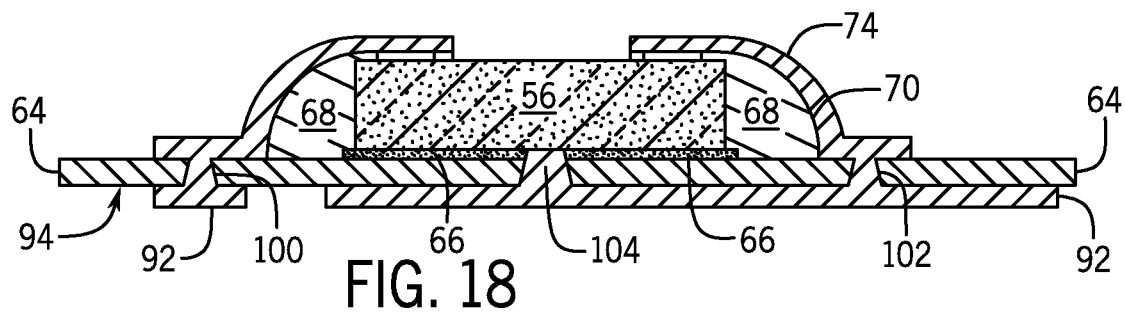
Figure 19:
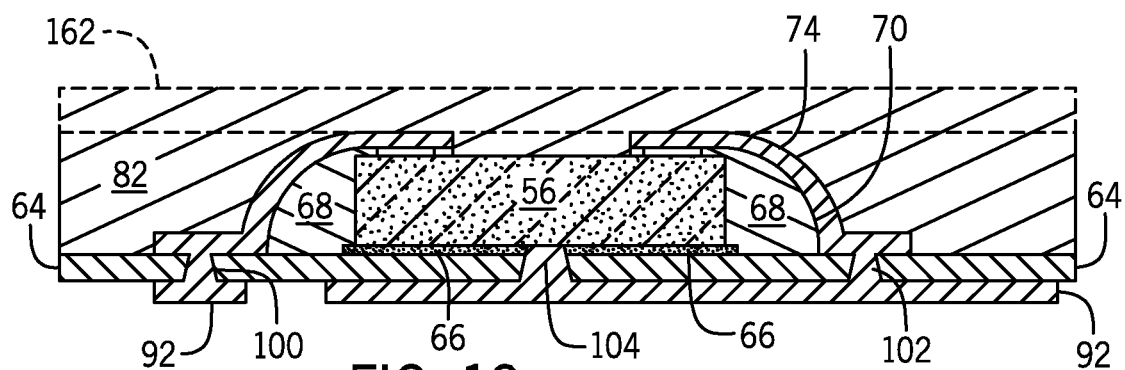
Figure 20:
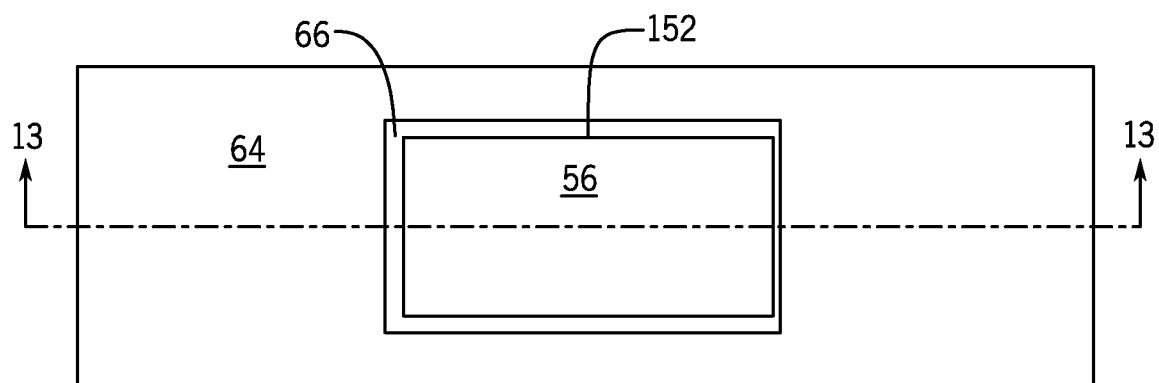
FIGS. 20 and 21 are schematic top views of the electronics package of FIG. 4 during select stages of the manufacturing/build-up process illustrated in FIGS. 13-19.
Figure 21:
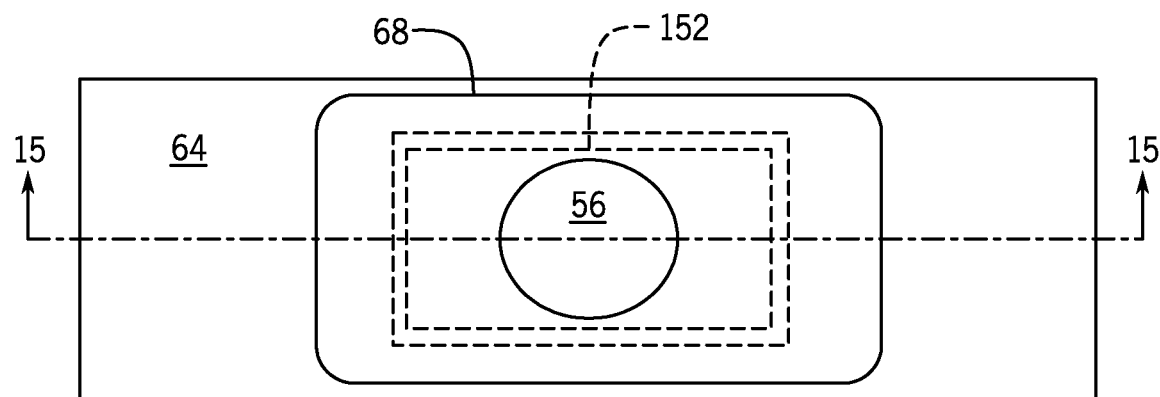
Figure 22:
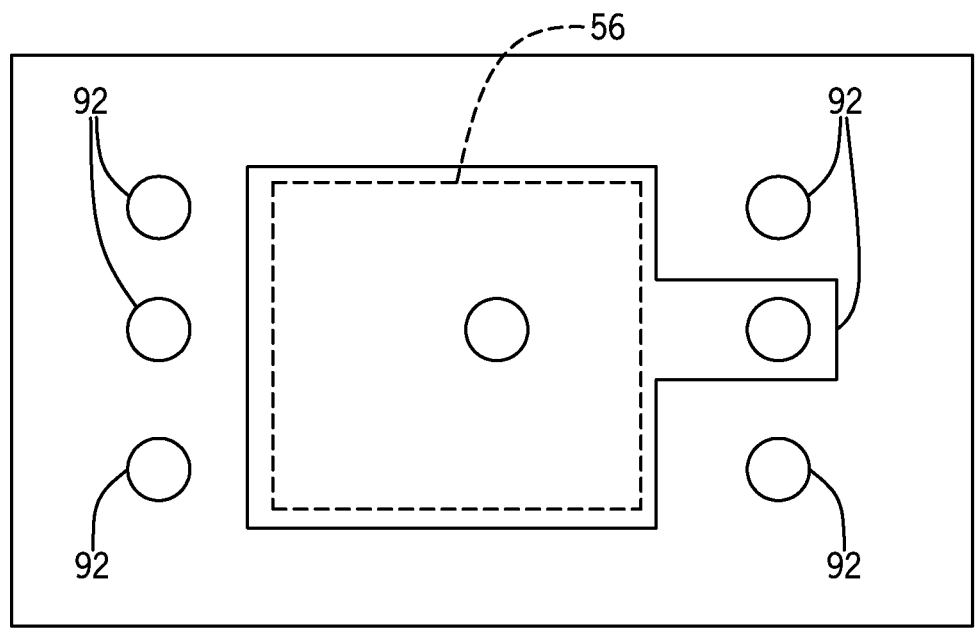
FIG. 22 is a bottom view of the electronics package of FIG. 4 illustrating an exemplary configuration of a wiring layer formed on the lower surface of the insulating substrate.

Referring now to FIGS. 13-19 depicting cross-sections and FIGS. 20-22 depicting topside views, a technique for manufacturing the electronics package 52 of FIG. 4 is set forth, according to one embodiment of the invention, with each figure illustrating a cross-section of the electronics package 52 during the build-up process. One skilled in the art will recognize that minor modifications to the steps described herein may be made to manufacture electronics packages 54, 114, 134, or variations thereof. While FIGS. 13-19 illustrate the manufacture of a single electronics package, one skilled in the art will recognize that multiple electronics packages could be manufactured in a similar manner at the panel level and then singulated into individual electronics packages as desired.

Figure 13:
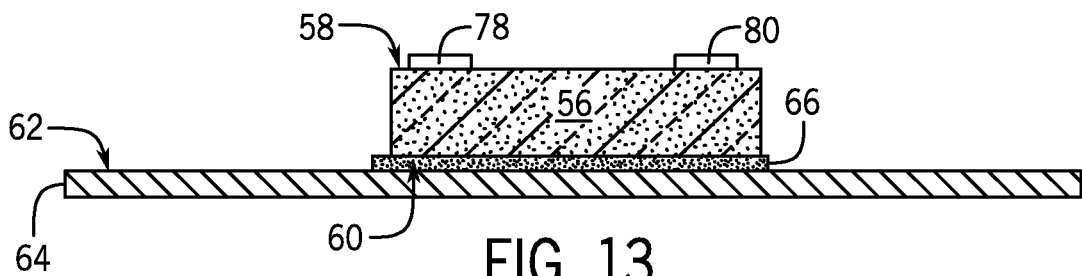
FIGS. 13, 14, 15, 16, 17, 18, and 19 are schematic cross-sectional side views of the electronics package of FIG. 4 during various stages of a manufacturing/build-up process, according to an embodiment of the invention.

Referring first to FIG. 13, fabrication of electronics package 52 begins by applying component attach material 66 to the first surface 62 of insulating substrate 64. Component attach material 66 is applied to coat die attach locations, and in some embodiments extends outside the outer perimeter 152 of the semiconductor device 56, as shown in FIG. 20. In some embodiments, the component attach material 66 may be applied by stencil, screen printing, or using a direct dispense technique such as ink jetting, for example. Component attach material 66 may have a thickness in the range of 2 to 50 micrometers. In alternative embodiments, component attach material 66 may be applied to semiconductor device 56 prior to positioning semiconductor device 56 on insulating substrate 64 or omitted entirely in cases where insulating substrate 64 has adhesive properties.

Semiconductor device 56 is placed back surface 60 face down with its topside surface with contact pads 78, 80 face up, into the component attach material 66 using conventional pick and place equipment and methods. After being positioned, the semiconductor device 56 is bonded to insulating substrate 64 by fully curing component attach material 66 using heat, UV light, or microwave radiation, as examples. In one embodiment, a partial vacuum and/or above atmospheric pressure may be used to promote the removal of volatiles from the adhesive during cure if any are present. One skilled in the art will recognize that alternative techniques for applying component attach material 66 may be utilized—for example applying a component attach material to coat the entirety of exposed surfaces of insulating structure 68 or by applying a component attach material 66 directly to the back surface 60 of semiconductor device 56 before placing the semiconductor device 56 onto insulating substrate 64.

Figure 14:
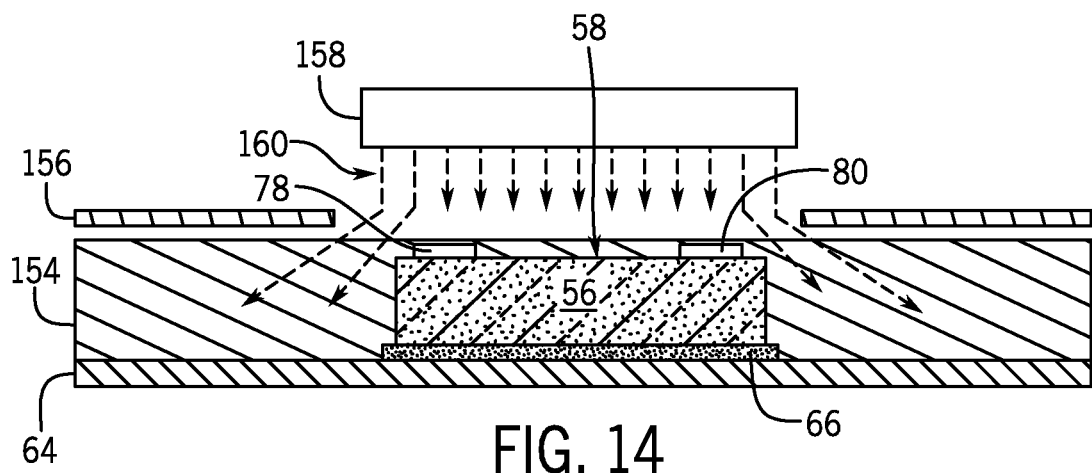
Figure 15:
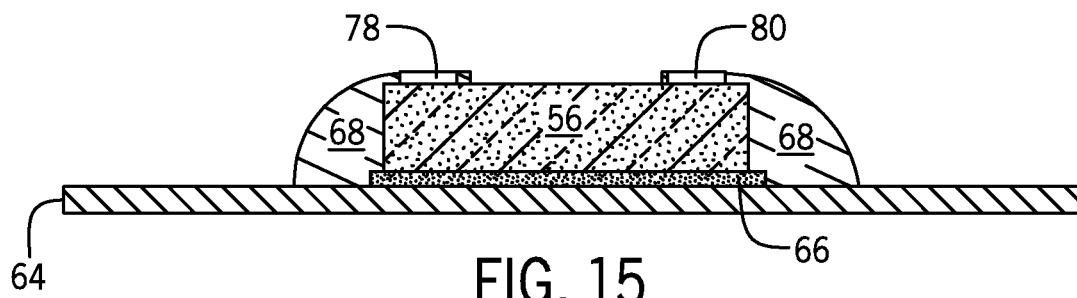
Figure 16:
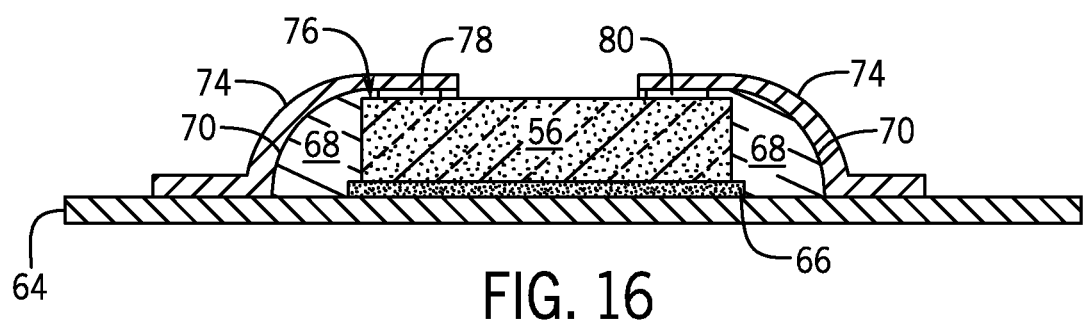

In a next step of the fabrication technique shown in FIG. 14, insulating structure 68 is formed by applying a layer of photo-patternable resin material 154 over the entire semiconductor device 56 and to coat the first surface 62 of insulating substrate 64 and the semiconductor device 56. A photo-patterning mask 156 is placed over the top surface of the photo-patternable resin material 154, which is then patterned by radiating a beam of unfocused light emitted by a light source 158 through one or more openings 160 in the mask 156. The width of the beam of light will expand as it extends into the photo-patternable resin material 154 and selectively cure regions of the photo-patternable resin material 154 below the opening 160. A solvent rinse is used thereafter to remove uncured photo-patternable resin material 154. Cured resin material is then removed from the contact pads 78, 80 and select portions of the active surface 58 of semiconductor device 56, leaving the cured insulating substrate 64 illustrated in FIG. 21. As shown, the insulating structure 68 surrounds the outer perimeter 152 of semiconductor device 56 and coats at least a portion of the active surface 58 of semiconductor device 56. In yet another embodiment, the insulating structure 68 may be patterned by a direct write imaging system such as a laser. Alternatively, insulating structure 68 may be formed using a grey scale mask.

In alternative embodiments, insulating structure 68 is formed by applying an insulating resin to at least one of the edges of the outer perimeter 152 of semiconductor device 56. This insulating resin may be, for example, an organic underfill resin or epoxy with filler material such as, for example, ceramic or silica filler particles, to reduce its coefficient of thermal expansion. Deposition of the insulating resin can be accomplished using a direct dispense tool such as an ink jet printer, a spray system, a 3D printing technique or a liquid dispense head, as non-limiting embodiments. Thereafter, the resin material is cured using heat, UV light, microwaves, or the like. Optionally, the insulating resin can be applied to form a layer of material coating the insulating substrate 64 and/or the active surface 58 of semiconductor device 56 and selectively patterned to remove select portions of the applied insulating resin on the insulating substrate 64 and/or the active surface 58 of semiconductor device 56 to yield the insulating structure 68 illustrated in FIG. 15.

After forming insulating structure 68, first wiring layer 74 (FIG. 16) is formed by applying a layer of conductive material on the outer surface 74 of insulating structure 68 and exposed regions of the first surface 62 of insulating substrate 64. According to alternative embodiments, the conductive material is metal such as copper, aluminum, or other standard wiring metal and may contain a barrier metal such as titanium and is deposited by one or more of sputtering, evaporation, electroless plating, electroplating, or other standard metal deposition processes. The conductive material is then patterned to form the first wiring layer 74. In one embodiment, the patterning step may be carried out using a semi-additive patterning technique wherein a first seed metal or barrier metal (e.g., titanium) is applied to the outer surface 74 of insulating structure 68 and the exposed regions of the first surface 62 of insulating substrate 64. A photo-resist (not shown) is applied to the seed metal and patterned, a layer of bulk metal (e.g., copper) is plated up atop the seed or barrier metal. The barrier layer can have a thickness of 0.01 to 1 micron and the bulk metal can have a thickness of 1 to 20 microns according to an exemplary, non-limiting embodiment. The photo-resist is removed and the exposed seed layer is removed by etching. The remaining seed metal and the plated up layer of metal form the first wiring layer 74 illustrated in FIG. 16. In alternative embodiments first wiring layer 74 may be formed using other known patterning techniques such as, for example, fully subtractive patterning, semi-additive pattern plate-up, or additive plate-up. In yet other embodiments, first wiring layer 74 is a printed conductive material formed using a deposition technique such as inkjet printing, screen printing, or dispensing, as non-limiting examples. It is contemplated that first wiring layer 74 may be formed using any known method capable of forming high density routing patterns with the desired current carrying capabilities.

Figure 17:
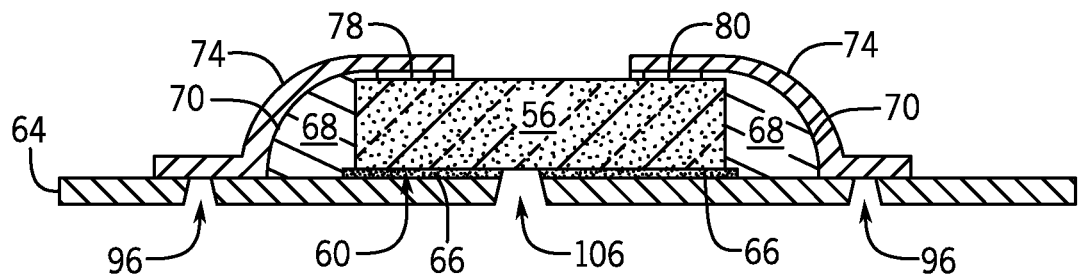

Referring next to FIG. 17, vias 96, 98, and optional via 106 are formed through insulating substrate 64 to select areas of first wiring layer 74 and optionally to the back surface 60 of semiconductor device 56 by known standard microvia processes, including laser drilling or ablation, mechanical drilling, photo-definition, plasma etch, or chemical etch, and the like. After the vias 96, 98, 106 are formed, a second layer of conductive material is deposited onto the second surface 94 of insulating substrate 64 and patterned thereafter to form second wiring layer 92 as shown in FIG. 18. Deposition and patterning may be carried out in a similar manner as described above for first wiring layer 74. This second layer of conductive material extends into vias 96, 98, 106, thereby forming penetrating contacts 100, 102, 104. A bottom side view of the electronics package 52 is illustrated in FIG. 22 to show one exemplary and non-limiting configuration of second wiring layer 92. One skilled in the art will recognize that the second wiring layer 92 may be similarly configured having a number of different traces in any of the other embodiments of the electronics packages disclosed herein.

The manufacturing process continues in FIG. 19 by applying insulating material 82 over the semiconductor device 56, insulating structure 68, and exposed portions of insulating substrate 64 to form a body for the electronics package 52. According to alternative and non-limiting embodiments, insulating material 82 may be applied using a pour molding, transfer molding, injection molding, or compression molding process. At this stage in the manufacturing process, microvias can be formed through insulating material 82 and a third layer of conductive material deposited on the insulating material 82 and thereafter patterned to form the third wiring layer 146 shown in FIG. 12. Alternatively, the top surface 124 of insulating material 82 may be back ground to remove a top portion 162 of insulating material 82 and expose portions of first wiring layer 74.

One skilled in the art will understand that a similar manufacturing process as described above with respect to FIGS. 13-19 and FIGS. 20-22 may be used to fabricate electronics package 54 (FIG. 6) by forming the larger thermal via 110 illustrated in FIG. 6 in place of via 106 at the same time and with the same methodology as vias 96, 98. The second layer of conductive material will fill into this via 110 and form the back side thermal structure 108 that provides a path to thermally cool the semiconductor device 56 and also serve as an electrical interconnect in certain embodiments, such as those in which semiconductor device 56 is a power device.

Manufacture of the electronics package 114 of FIG. 7 begins with the fabrication steps of FIGS. 13-18 modified as described in the preceding paragraph to include forming the back side thermal structure 108 as part of the second wiring layer 92. After the second wiring layer 92 is formed, core structure 116 (FIG. 7) is coupled to the first surface 62 of insulating substrate 64 with joining material 118 (FIG. 7). Insulating material 82 is then applied in the opening 120 of core structure 116 to encapsulate semiconductor device 56, first wiring layer 74, and insulating structure 68, thereby forming the electronics package 114 illustrated in FIG. 7.

Figure 23:
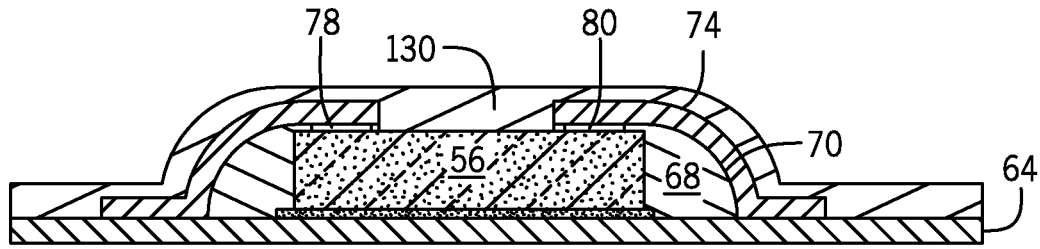
FIGS. 23, 24, 25, and 26 are schematic cross-sectional side views of the electronics package of FIG. 9 during various stages of a manufacturing/build-up process, according to an embodiment of the invention.
Figure 24:
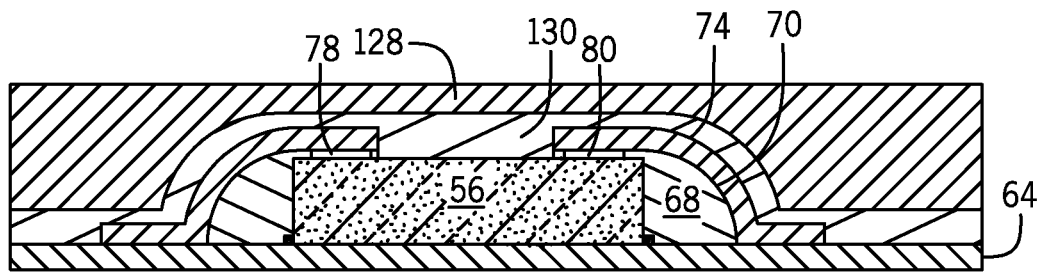

Manufacture of the electronics package 126 of FIG. 10 begins by attaching semiconductor device 56 to insulating substrate 64 and forming insulating structure 68 and first wiring layer 74 in a similar manner as described with respect to FIGS. 13-16. In a next step of the manufacturing process, illustrated in FIG. 23, a layer of thermally conductive material 130 is applied over first wiring layer 74, exposed portions of active surface 58 of semiconductor device 56, and exposed portions of insulating substrate 64. The layer of thermally conductive material 130 may be applied by spray coating, ink jetting, or any other known deposition process. Next, the top side thermal structure 128 is positioned into the layer of thermally conductive material 130, as shown in FIG. 24.

Figure 25:
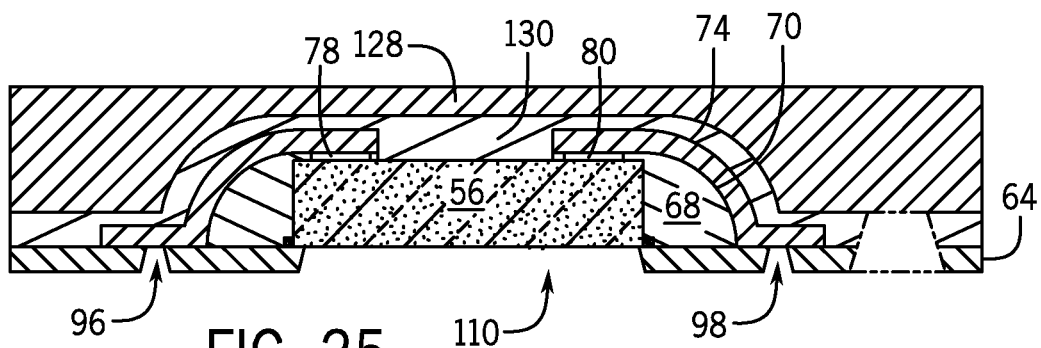
Figure 26:
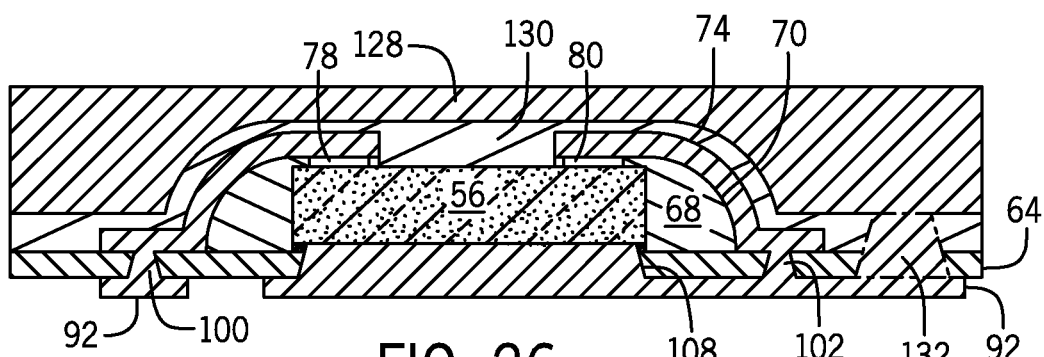

After the top side thermal structure 128 is in place, vias 96, 98, 110 and optional through holes 132 (shown in phantom) are formed through insulating substrate 64 and, in the case of through holes 132, through a portion of the layer of thermally conductive material 130, as shown in FIG. 25. A layer of conductive material is then deposited onto the second surface 94 of insulating substrate 64 and into vias 96, 98, 110 and through holes 132. The conductive material layer is patterned to form second wiring layer 92, as shown in FIG. 26. This deposition and patterning step is carried out in a similar manner as described with respect to FIG. 18.

Figure 27:
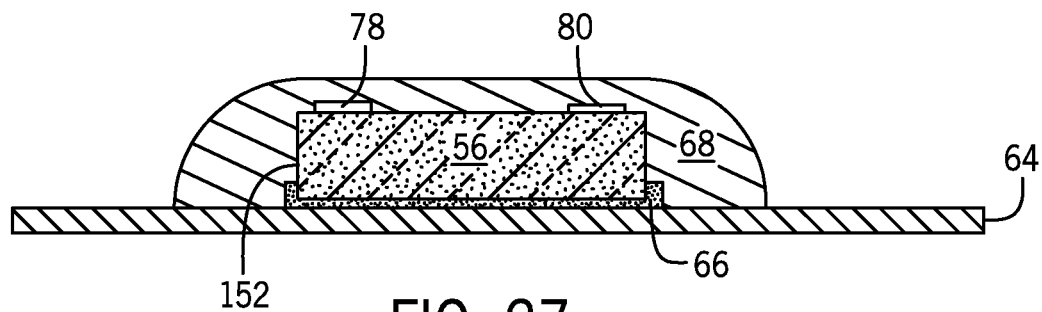
FIGS. 27, 28, and 29 are schematic cross-sectional side views of the electronics package of FIG. 10 during various stages of a manufacturing/build-up process, according to an embodiment of the invention.

Manufacture of the electronics package 134 of FIG. 10 would begin by applying semiconductor device 56 to insulating substrate 64 in a similar manner as described in FIG. 13. The process would continue by applying an insulating resin to fully coat the active surface 58 of semiconductor device 56, at least one side wall of semiconductor device 56, and select portions of insulating substrate 64 that surround the outer perimeter 152 of semiconductor device 56 to form the insulating structure 68 shown in FIG. 27. Deposition of insulating resin may be accomplished using any of the techniques described with respect to FIG. 14.

Figure 28:
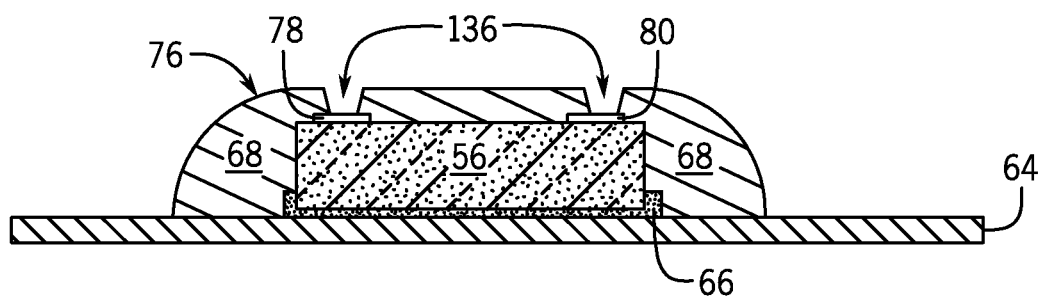
Figure 29:
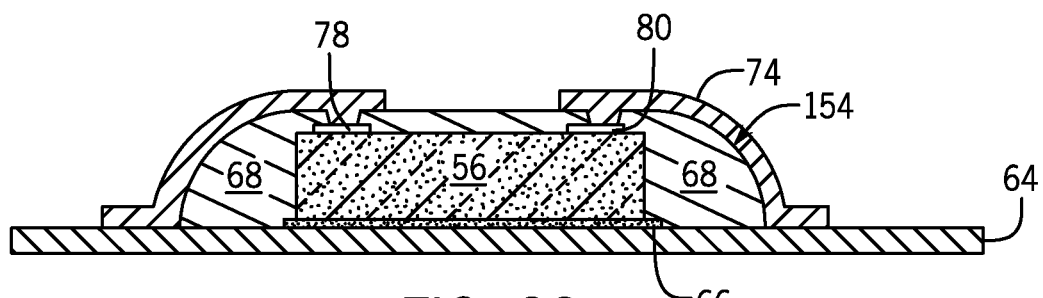

Referring to FIG. 28, after the insulating resin is cured to form insulating structure 68, one or more microvias 136 are formed through the insulating structure 68 to the contact pads 78, 80 on the active surface 58 of semiconductor device 56. Microvias 136 are formed using similar techniques as described above for vias 96, 98. The first wiring layer 74, shown in FIG. 29, is then formed by depositing and patterning a layer of conductive material on the outer surface 74 of insulating structure 68 using any of the previously described techniques. Fabrication of electronics package 134 would then continue in accordance with the steps illustrated in FIGS. 17-19 as modified to form the back side thermal structure 108 in the manner described for electronics package 54.

Figure 30:
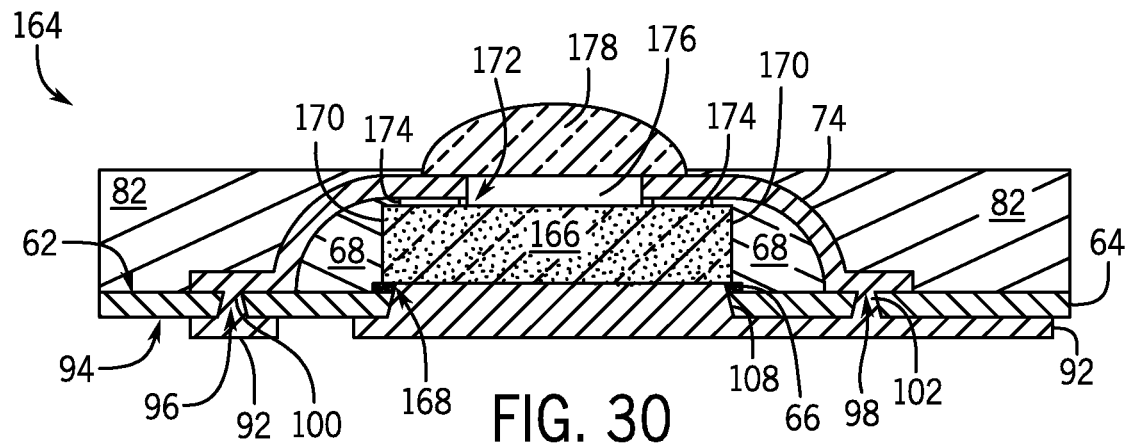
FIG. 30 is a schematic cross-sectional view of an electronics package including an optical component, according to an embodiment of the invention.

Referring now to FIG. 30, an electronics package 164 containing a light emitting diode (LED) semiconductor device 166 is illustrated according to an alternative embodiment of the invention. Similar components within electronics package 164 and electronics package 52 (FIG. 4) are described with common part numbering as appropriate. LED semiconductor device 166 is arranged on insulating substrate 64 with its back surface 168 mounted to the first surface 62 of insulating substrate 64 by way of a component attach material 66. Insulating substrate 68 encapsulates the side walls 170 and portions of the active surface 172 of LED semiconductor device 166 as well as portions of the first surface 62 of insulating substrate 64.

First wiring layer 74 is disposed on the outer surface 74 of insulating structure 68 and is coupled to contact pads 174 of LED semiconductor device 166. Second wiring layer 92 is disposed on the second surface 94 of insulating substrate 64 and is coupled to first wiring layer 74 through vias 96, 98. In the illustrated embodiment, second wiring layer 92 also includes a back side thermal structure 108. However, back side thermal structure 108 may be omitted in alternative embodiments or replaced by a electrical connection to the back surface 168 of LED semiconductor device 166 similar to penetrating contact 104 (FIG. 4).

As shown in FIG. 30, insulating material 82 covers the first wiring layer 74, exposed portions of the insulating structure 68, and exposed portions of the insulating substrate 64. A phosphor layer 176 overlays the exposed portions of the active surface 172 of the LED semiconductor device 166, which have optical functionality. A lens 178 is formed over the phosphor layer 176.

Figure 31:
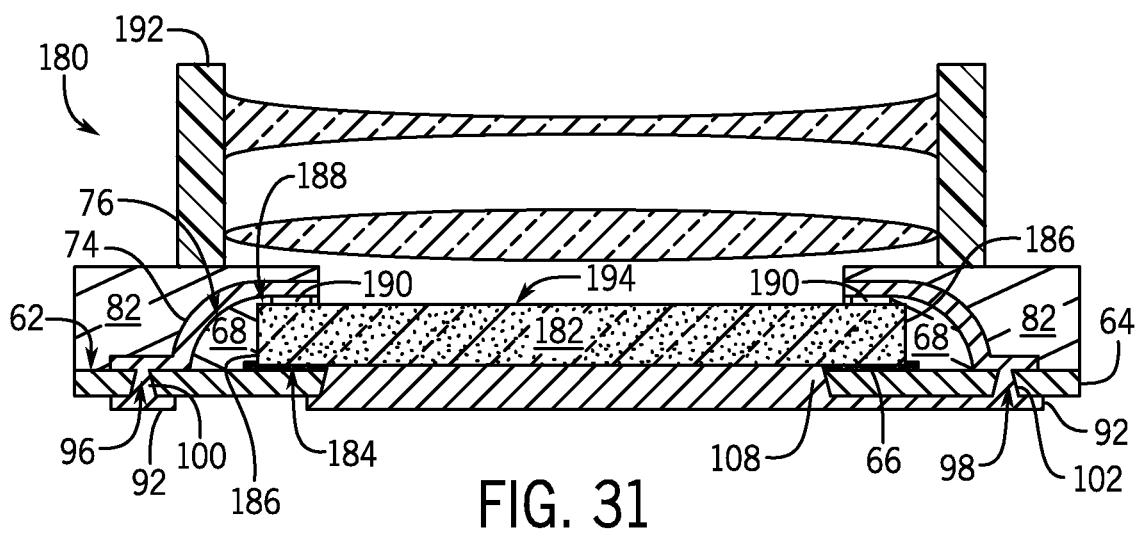
FIG. 31 is a schematic cross-sectional view of an electronics package including an imaging component, according to another embodiment of the invention.

In yet another embodiment of the invention, an electronics package 180 contains a semiconductor imager chip 182 as illustrated in FIG. 31. Electronics package 180 contains numerous similar components as electronics package 52 (FIG. 4), which are referred to with common reference numbers. Similar to the semiconductor device 56 of electronics package 52, the back surface 184 of semiconductor imager chip 182 is coupled to the first surface 62 of insulating substrate 64 with component attach material 66. Insulating structure 68 is formed to encapsulate the side walls 186 of semiconductor imager chip 182, portions of the active surface 188 of semiconductor imager chip 182, and portions of the insulating substrate 64 in the area surrounding semiconductor imager chip 182. First wiring layer 74 is disposed on the outer surface 74 of insulating structure 68 and is electrically coupled to contact pads 190 on the active surface 188 of semiconductor imager chip 182. Second wiring layer 92 is deposited on the second surface 94 of insulating substrate 64 and forms penetrating contacts 100, 102 through insulating substrate 64 and a back side thermal structure 108 coupled to the back surface 184 of semiconductor imager chip 182. Insulating material 82 covers the first wiring layer 74, exposed portions of the insulating structure 68, and exposed portions of the insulating substrate 64.

Electronics package 180 also includes a lens structure 192 that is coupled to the top surface 124 of insulating material 82 and spans across an exposed portion 194 of the active surface 188 of the semiconductor imager chip 182 having imaging functionality. Lens structure 192 may include a single lens, or multiple lenses, or a combination of multiple lenses and filters, according to alternative embodiments.

Figure 32:
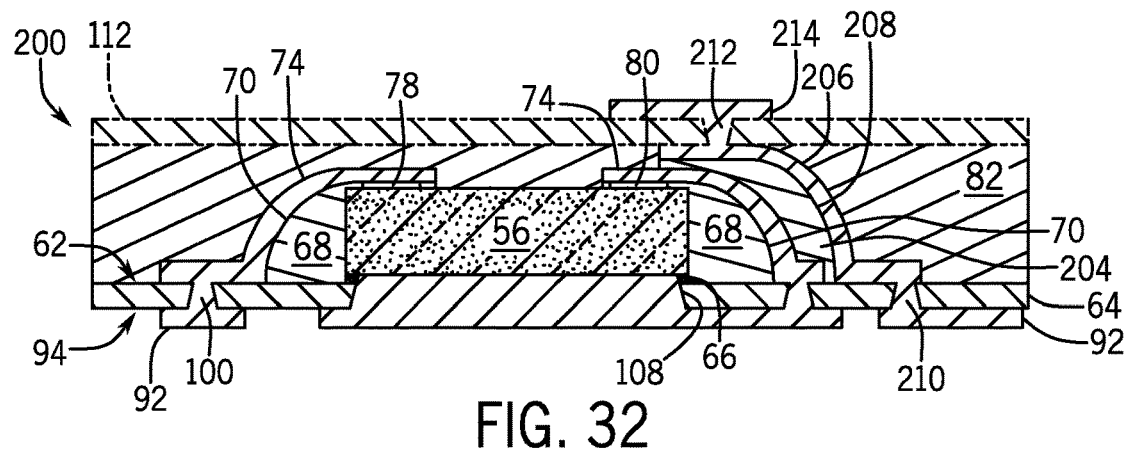
FIG. 32 is a schematic cross-sectional view of an electronics package that includes a double-sloped insulating structure, according to another embodiment of the invention.
Figure 33:
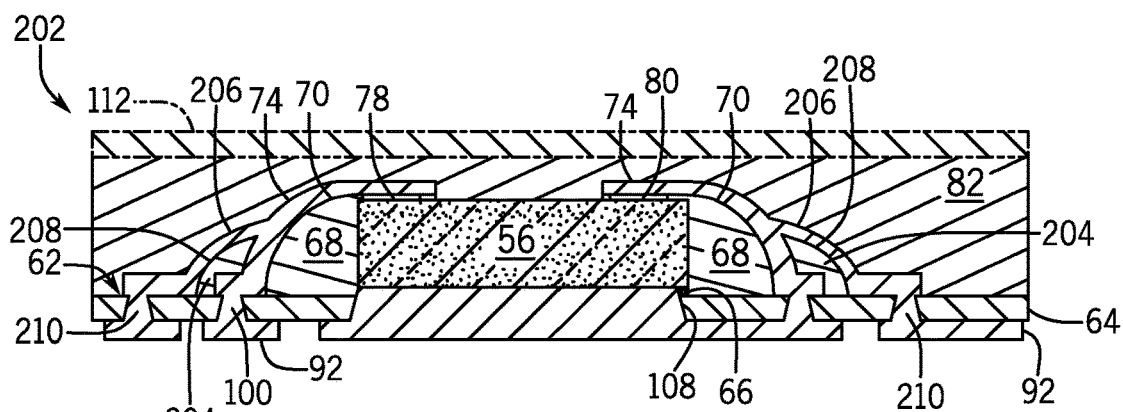
FIG. 33 is a schematic cross-sectional view of an electronics package that includes a double-sloped insulating structure, according to another embodiment of the invention.

Two alternative embodiments of an electronics package 200, 202 are illustrated in FIGS. 32 and 33. Electronics packages 200 and 202 each include a number of common structures as electronics package 54 (FIG. 6), which are referred to with common part numbers as appropriate. In the illustrated embodiments, wiring layer 74 is formed in a similar manner as described with respect to FIG. 6 and may include electrical traces arranged in a similar manner as that shown in FIG. 5 or in any number of alternative configurations based on the particular arrangement of contact pads on the active surface of semiconductor device 56.

In addition to structures common to electronics packages 200, 202, and 54, electronics packages 200, 202 each include a second insulating structure 204 that is formed atop or directly adjacent at least a portion of the insulating structure 68. The second insulating structure 204 may be formed using any of the same materials and techniques described herein with respect to insulating structure 68. Second insulating structure 204 may be formed at one or more discrete locations atop insulating structure 68, as shown in FIG. 32, or may completely surround insulating structure 68, as shown in FIG. 33.

A wiring layer 206 is formed on the sloped surface 208 of second insulating structure 204 using any of the same materials and techniques as described with respect to wiring layer 74. Wiring layer 206 is electrically coupled to wiring layer 92 by one or more penetrating contacts 210 that extend through insulating substrate 64. In some embodiments, such as illustrated in FIG. 32, another penetrating contact 212 may extend through second insulating substrate 112 to similarly electrically couple wiring layer 206 to a third wiring layer 214 formed atop second insulating substrate 112. In electronics package 200, the second insulating structure 204 is formed having a height larger than that of insulating structure 68 to facilitate a connection between wiring layers 92 and 214. In electronics package 202, second insulating structure 204 is formed having a height less than that of insulating structure 68, with wiring layer 206 forming an electrical connection between wiring layers 74 and 92.

Figure 34:
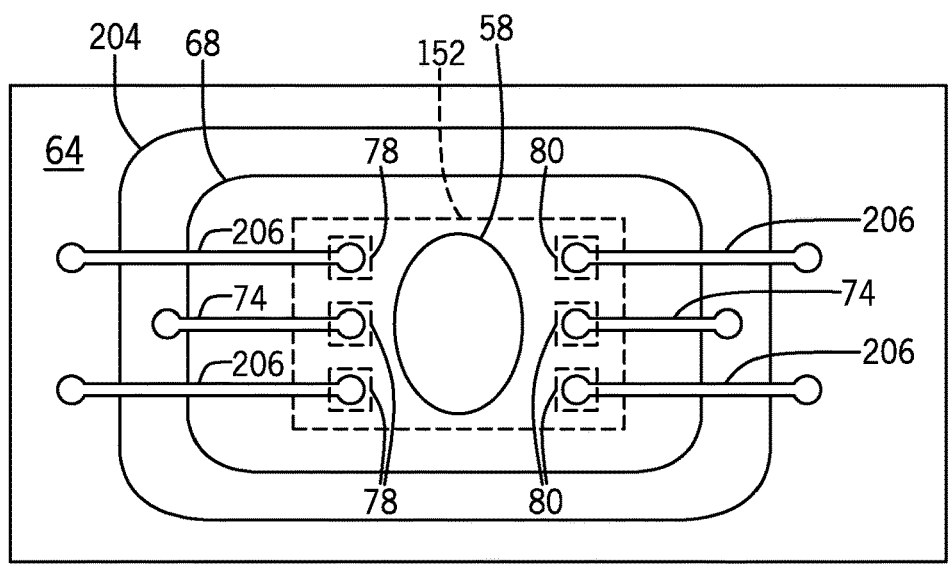
FIG. 34 is a topside view of an electronics package that includes a double-sloped insulating structure, according to another embodiment of the invention.

An exemplary configuration of wiring layers 74 and 206 is illustrated in FIG. 34. One skilled in the art will recognize that wiring layers 74 and 206 may be formed in numerous alternative configurations based on the contact pad configuration of semiconductor device 56 and the desired location of I/Os within the final electronics package. The geometry of insulating structures 68, 204 may likewise be varied from that illustrated in FIGS. 32 and 33 based on design specifications. As such, the geometry of insulating structures 68, 204 and the arrangement of wiring layers 74 and 206 is not limited to that illustrated in FIGS. 32-34. The "double-sloped" surface configuration resulting from the combination of insulating substrates 68, 204 and their associated wiring layers 74, 206 may be incorporated into any of the other electronic package embodiments described herein. Additionally, it is contemplated that the double-sloped surface configuration may be extended to include three or more layers of insulating substrate/wiring layer stackups.

In each of the electronics packages described above, the first wiring layer 74 is formed to extend along at least one sloped side wall 70 of insulating structure 68. This first wiring layer 74 forms electrical connections between the contact pads 78, 80, 174, 190 of respective electrical component 56, 166, 182 and the opposing surface of the electronics package in a manner that involves fewer and less complex processing steps than conventional embedded semiconductor manufacturing techniques. By using the sloped side wall 70 a higher level of routing density can be achieved than with the conventional through hole structures because the resulting electrical traces of first wiring layer 74 take up less area than the conventional through hole structures. As a result, the overall size of the electronics package can be reduced as compared to that of prior art embedded device technology. First wiring layer 74 also yields connections with lower inductance and parasitic or interconnect resistance than prior art packaging techniques. The size of the individual traces and terminal pads of first wiring layer 74 and the corresponding penetrating contacts that couple first wiring layer 74 to the second wiring layer 92 can easily be varied within the electronics package. Utilizing an insulating structure 68 also provides improved thermal dissipation within the resulting electronics package.

The order and sequence the process or method steps associated with the above-described manufacturing or build-up technique for electronics packages may be modified from that described herein while still arriving at an equivalent or substantially equivalent end structure. As one non-limiting example, in embodiments that include second insulating substrate 112, insulating material 82 may be applied using an underfill technique after the insulating substrate 112 is incorporated within the electronics package. Additionally, some or all of vias 96, 98, 110 may be formed before semiconductor device 56 is coupled to insulating substrate 64 and the formation and patterning of the first and second wiring layers may occur simultaneously or in the opposite order previously described herein.

Beneficially, embodiments of the invention thus provide for higher power handling and performance and smaller form factor compared to a prior art wire bonding package and higher thermal performance and lower costs compared to a prior art flip chip package. Embodiments of the invention disclosed herein also provide a lower cost, faster turn time process than existing prior art embedded power packages. Accordingly, the embodiments described herein provide a low cost solution with higher performance as compared to prior art approaches.

Therefore, according to one embodiment of the invention, an electronics package includes an insulating substrate, an electrical component having a back surface coupled to a first surface of the insulating substrate, and an insulating structure surrounding at least a portion of a perimeter of the electrical component. A first wiring layer extends from the first surface of the insulating substrate and over a sloped side surface of the insulating structure to electrically couple with at least one contact pad on an active surface of the electrical component. A second wiring layer is formed on a second surface of the insulating substrate and extends through at least one via therein to electrically couple with the first wiring layer.

According to another embodiment of the invention, a method of manufacturing an electronics package includes coupling a back surface of an electrical component to a first surface of an insulating substrate and forming an insulating structure around at least a portion of a perimeter of the electrical component. The method also includes forming a first wiring layer on a portion of the first surface of the insulating substrate and over a sloped side surface of the insulating structure to electrically couple with at least one contact pad on an active surface of the electrical component. The method further includes electrically coupling the first wiring layer to a second wiring layer disposed on a second surface of the insulating substrate through at least one via formed through the insulating substrate.

According to yet another embodiment of the invention, an electronics package includes an electrical component having a back surface coupled to a first surface of an insulating substrate and an active surface facing away from the insulating substrate, the active surface having at least one of imaging and optical functionality. The electronics package also includes an insulating structure surrounding a perimeter of the electrical component and covering a portion of the active surface thereof. A first wiring layer is formed on a sloped side wall of the insulating structure and is electrically coupled to at least one contact pad on the active surface of the electrical component. A second wiring layer is formed on a second surface of the insulating substrate and is electrically coupled to the first wiring layer through at least one via formed in the insulating substrate.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   an insulating substrate comprising a first surface and a second surface opposite the first surface;
   an electrical component having an active surface, a back surface opposite the active surface, and a plurality of side walls extending between the active surface and the back surface;
   wherein the back surface is coupled to the first surface of the insulating substrate;
   wherein the active surface has at least one contact pad thereon;
   an insulating structure encapsulating at least a portion of a perimeter of the electrical component formed by the plurality of side walls, the insulating structure absent from a majority of an area between the electrical component and the insulating substrate and comprising a sloped side surface;
   a first wiring layer extending from the first surface of the insulating substrate and along the sloped side surface of the insulating structure to electrically couple with the at least one contact pad on the active surface of the electrical component; and
   a second wiring layer formed on the second surface of the insulating substrate and extending through at least one via in the insulating substrate to electrically couple with the first wiring layer.

2. The electronics package of claim 1 wherein the insulating structure completely surrounds the perimeter of the electrical component and covers at least a portion of the active surface thereof.

3. The electronics package of claim 1 further comprising an insulating material formed on a portion of the insulating substrate and surrounding the first wiring layer and the insulating structure.

4. The electronics package of claim 3 wherein the electrical component and the insulating material are positioned between the insulating substrate and another insulating substrate.

5. The electronics package of claim 1 wherein the first wiring layer comprises a plurality of electrical traces electrically coupled to a plurality of contact pads of the at least one contact pad of the electrical component.

6. The electronics package of claim 5 wherein the second wiring layer comprises:
   a first electrical trace extending through a first via in the insulating substrate to electrically couple with a first electrical trace of the plurality of electrical traces; and
   a second electrical trace extending through a second via in the insulating substrate to electrically couple with a second electrical trace of the plurality of electrical traces.

7. The electronics package of claim 6 wherein the second electrical trace is electrically coupled to the back surface of the electrical component through a third via in the insulating substrate.

8. The electronics package of claim 1 wherein the first wiring layer extends through at least one via in the insulating structure to electrically couple with the at least one contact pad of the electrical component.

9. The electronics package of claim 1 further comprising:
   a joining layer applied to the first wiring layer and an exposed surface of the insulating structure; and
   a thermally conductive structure having a first surface coupled to the joining layer.

10. The electronics package of claim 1 further comprising a passive component electrically coupled to the electrical component by way of the first wiring layer.

11. A method of manufacturing an electronics package comprising:
    coupling a back surface of an electrical component to a first surface of an insulating substrate;
    wherein the insulating substrate comprises a first surface and a second surface opposite the first surface;
    wherein the electrical component comprises:
      an active surface opposite the back surface;
      at least one contact pad on the active surface; and
      a plurality of side walls extending between the active surface and the back surface
    forming an insulating structure encapsulating at least a portion of a perimeter of the electrical component formed by the plurality of side walls, the insulating structure absent from a majority of an area between the electrical component and the insulating substrate and comprising a sloped side surface;
    forming a first wiring layer on a portion of the first surface of the insulating substrate and along the sloped side surface of the insulating structure to electrically couple with the at least one contact pad; and
    electrically coupling the first wiring layer to a second wiring layer disposed on the second surface of the insulating substrate through at least one via formed through the insulating substrate.

12. The method of claim 11 further comprising forming the first wiring layer having a pattern of electrical traces extending over the sloped side surface of the insulating structure to electrically couple respective contact pads of the electrical component to respective portions of the second wiring layer.

13. The method of claim 11 further comprising:
    forming a plurality of vias through the insulating substrate; and
    disposing the second wiring layer on the second surface of the insulating substrate to extend through at least one via of the plurality of vias to electrically couple with the first wiring layer and extend through another via of the plurality of vias to at least one of electrically and thermally couple with the back surface of the electrical component.

14. The method of claim 11 further comprising surrounding the first wiring layer and the insulating structure with an insulating material.

15. The method of claim 14 further comprising:
coupling a support substrate to the insulating substrate, the support substrate having an opening formed therein sized to surround the electrical component; and
disposing the insulating material within the opening.

16. The method of claim 11 further comprising:
coating the first wiring layer and exposed portions of the insulating structure and the first surface of the insulating substrate with a joining material;
disposing a thermally conductive structure atop the joining material; and
coupling the second wiring layer to the thermally conductive structure through at least one via in the insulating substrate.

17. An electronics package comprising:
an electrical component having a back surface coupled to a first surface of an insulating substrate, an active surface facing away from the insulating substrate, and a plurality of side walls extending between the active surface and the back surface, the active surface having at least one of imaging and optical functionality;
an insulating structure encapsulating a perimeter of the electrical component formed by the plurality of side walls and covering a portion of the active surface thereof, wherein the insulating structure is absent from a majority of an area between the electrical component and the insulating substrate;
a first wiring layer formed on a sloped side wall of the insulating structure and electrically coupled to at least one contact pad on the active surface of the electrical component; and
a second wiring layer formed on a second surface of the insulating substrate opposite the first surface and electrically coupled to the first wiring layer through at least one via formed in the insulating substrate.

18. The electronics package of claim 17 further comprising at least one lens positioned atop the active surface of the electrical component.

19. The electronics package of claim 17 further comprising an insulating material surrounding the insulating structure and at least a portion of the first wiring layer.

20. The electronics package of claim 17 wherein the second wiring layer is coupled to the back surface of the electrical component through another via formed in the insulating substrate.

* * * * *